United States Patent [19]
Garshelis

[11] Patent Number: 5,520,059
[45] Date of Patent: May 28, 1996

[54] CIRCULARLY MAGNETIZED NON-CONTACT TORQUE SENSOR AND METHOD FOR MEASURING TORQUE USING SAME

[75] Inventor: Ivan J. Garshelis, Pittsfield, Mass.

[73] Assignee: Magnetoelastic Devices, Inc., Pittsfield, Mass.

[21] Appl. No.: 253,022

[22] Filed: Jun. 2, 1994

Related U.S. Application Data

[63] Continuation-in-part of Ser. No. 736,299, Jul. 29, 1991, Pat. No. 5,351,555.

[51] Int. Cl.$^6$ ........................................... G02L 3/02
[52] U.S. Cl. ........................... 73/862.335; 73/862.333
[58] Field of Search ................. 73/862.333, 862.335, 73/862.336; 336/30; 324/209, 207.21

[56] References Cited

U.S. PATENT DOCUMENTS

| | | | |
|---|---|---|---|
| 2,511,178 | 6/1950 | Roters | 73/862.333 |
| 3,939,448 | 2/1976 | Garshelis | 335/215 |
| 4,627,298 | 12/1986 | Sahashi et al. | 73/862.336 |
| 4,760,745 | 8/1988 | Garshelis | 73/862.333 |
| 4,805,466 | 2/1989 | Schiessle et al. | 73/862.336 |
| 4,882,936 | 11/1989 | Garshelis | 73/862.333 |
| 4,891,992 | 1/1990 | Kodayashi et al. | 73/862.333 |
| 4,896,544 | 1/1990 | Garshelis | 73/862.333 |
| 4,899,598 | 2/1990 | Gumaste et al. | 73/862.335 |

FOREIGN PATENT DOCUMENTS

| | | |
|---|---|---|
| 0162957 | 12/1984 | European Pat. Off. . |
| 0272122 | 6/1988 | European Pat. Off. . |

(List continued on next page.)

OTHER PUBLICATIONS

Garshelis, "A Study of the Inverse Wiedemann Effect on Circular Remanence," IEEE Trans. on Magn., MAG–10 No. 2 344–58 (1974).

Garshelis, "The Wiedemann Effects and Applications," IEEE Applied Magnetics Conference, 75 CHO964–7 MAG, 38 pages (1975).

Garshelis, "Conditions for Stress Induced Bulk Moments," J. Appl. Phys. 50(3), 1680–2 (1979).

Garshelis, "A Versatile Magnetostrictive Displacement Transducer," IEEE Industrial Electronics Control Instrumentation Conference, 76 CH1 117–1 IECI, 99–105 (1976).

Y. Nonomura, E. A. "Measurements of Engine Torque with the Inter–Bearing Torque Sensor," SAE Technical Paper 1988, pp. 2.329–2.339.

G. Reiniger, "Halbleitersensoren Fur Massenmarkte," Elektrotechnik, Jan., 1985, Wurzburg DE, pp. 199–202.

*Primary Examiner*—Richard Chilcot
*Assistant Examiner*—Elizabeth L. Dougherty
*Attorney, Agent, or Firm*—Sixbey, Friedman, Leedom & Ferguson

[57] ABSTRACT

A torque sensor comprises a magnetoelastically active element, and a magnetic sensor, such as a Hall effect sensor, responsive to the field of the magnetoelastically active portion. In one embodiment, the magnetoelastically active portion comprises a ring of material endowed with an effective uniaxial magnetic anisotropy such that the circumferential direction is the easy axis, and magnetically polarized in a substantially circumferential direction. The ring is attached to the torqued member, such as a rotating shaft, so that application of a torque to the shaft is transmitted to therting. The torque on the ring reorients the circumferential magnetic orientation of the ring, producing a helical magnetic orientation having both circumferential and axial components. A magnetic field vector sensor is mounted in a fixed position relative to the ring and oriented so that it responds maximally only to the field due to the axial magnetization components of the ring. The output of the sensor is thus proportional to the change in orientation of the magnetization resulting from torque applied to the shaft and transmitted to the ring. In another embodiment, the magnetoelastically active portion includes two or more axially distinct, magnetically contiguous, oppositely polarized circumferential regions. The regions may comprise physically separate rings or may be formed onto a single ring.

59 Claims, 19 Drawing Sheets

FOREIGN PATENT DOCUMENTS

| | | |
|---|---|---|
| 0352187 | 1/1990 | European Pat. Off. . |
| 0422702 | 4/1991 | European Pat. Off. . |
| 1115051 | 10/1961 | Germany . |
| 59-009528 | 1/1984 | Japan . |
| 1318933 | 12/1989 | Japan ................................ 73/862.336 |
| 2167565 | 5/1986 | United Kingdom . |
| 9001781 | 2/1990 | WIPO . |

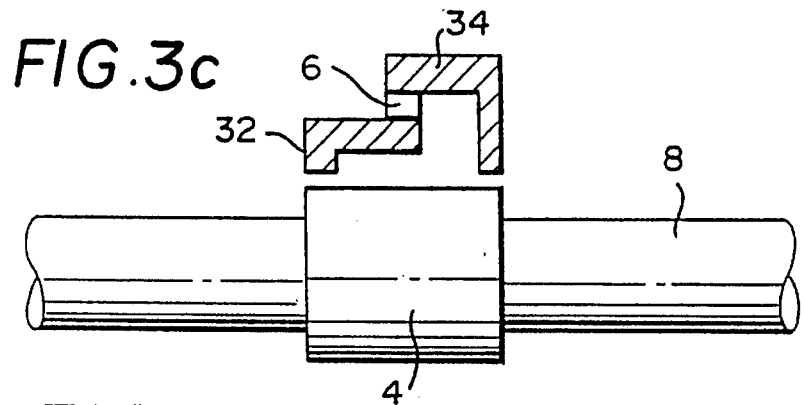
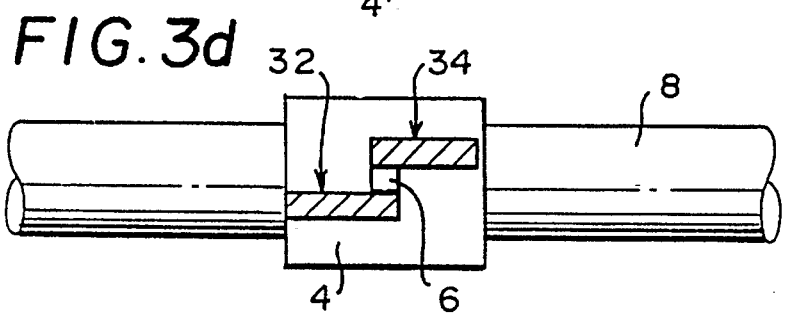
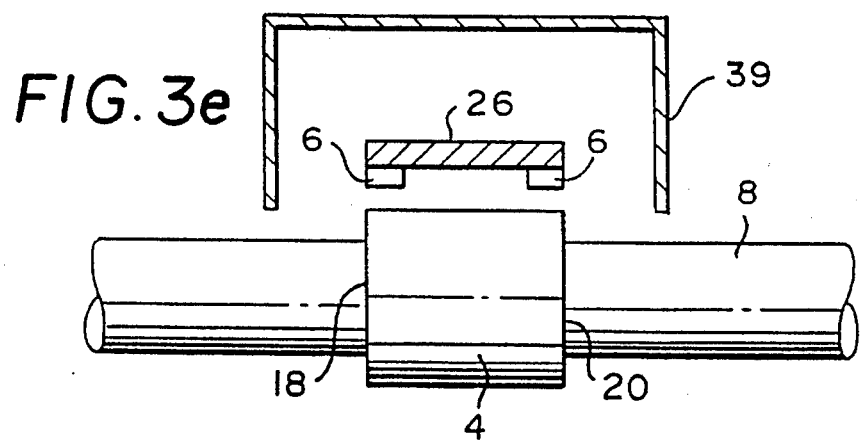
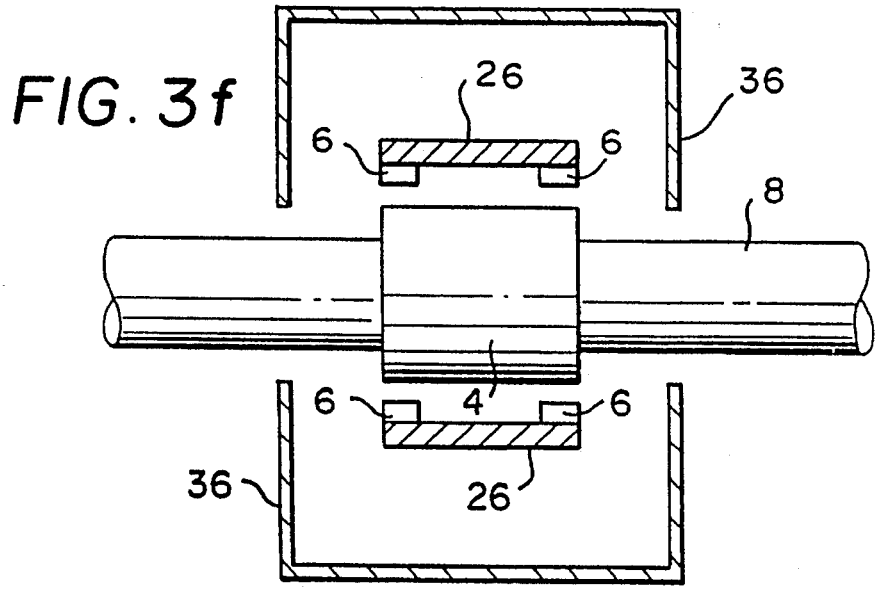

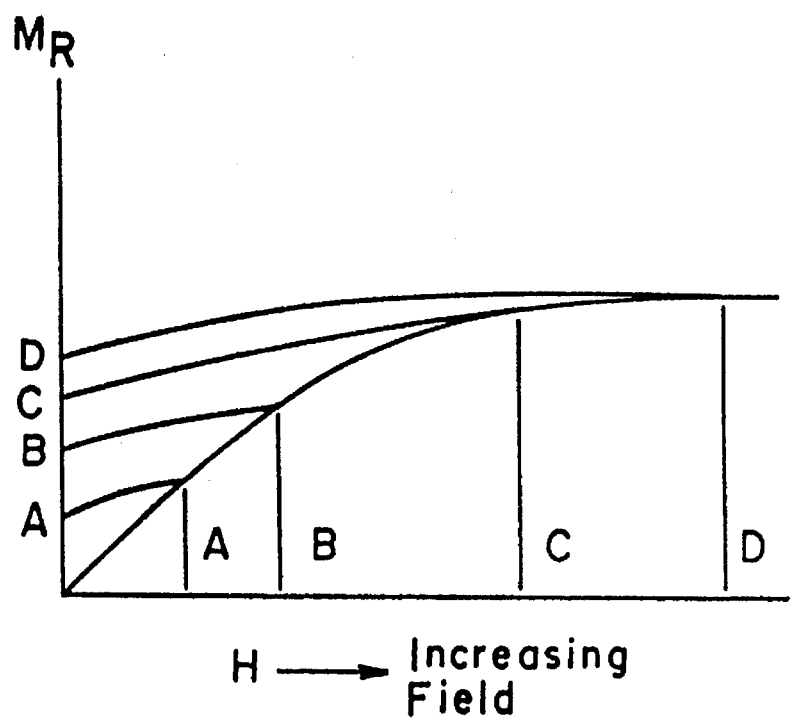
FIG. 5a
FIG. 5b
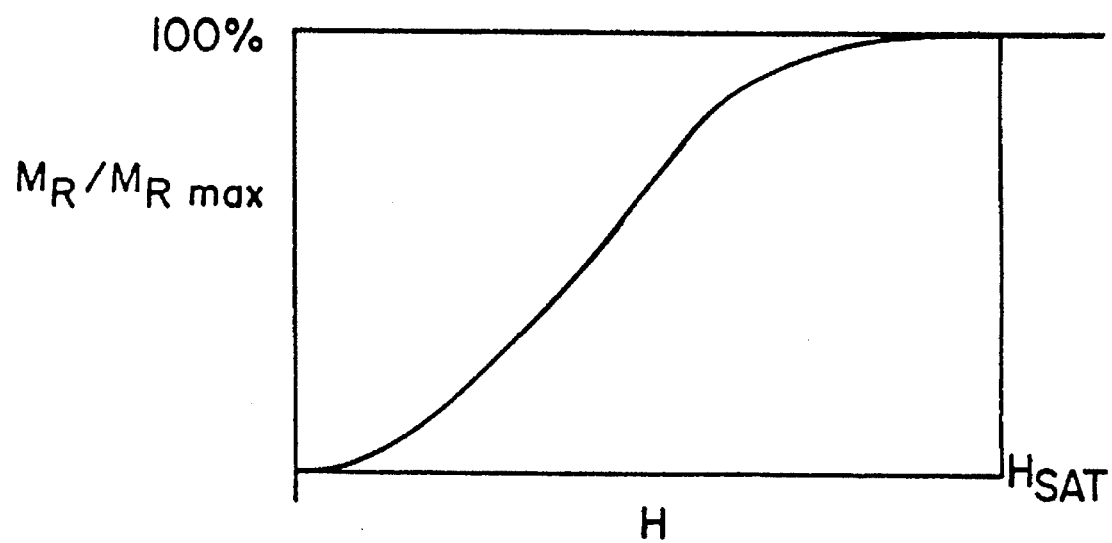

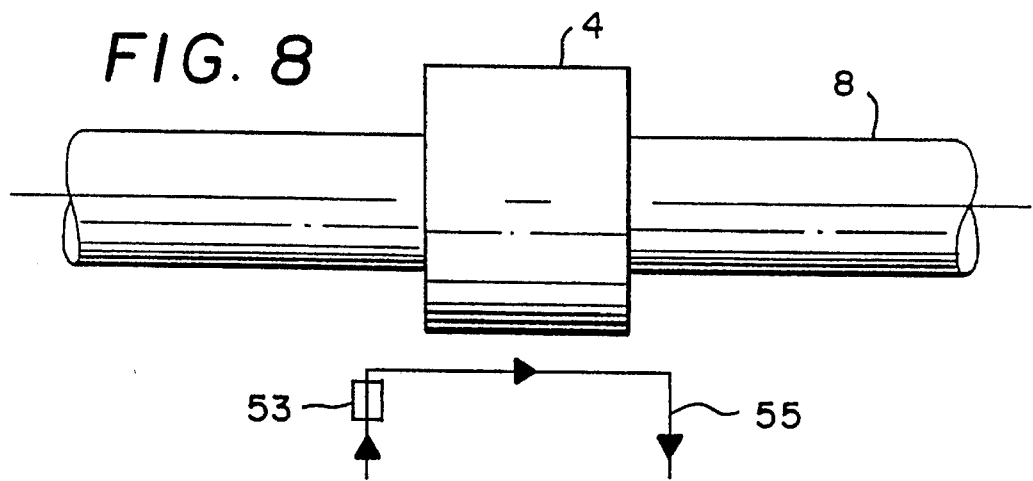
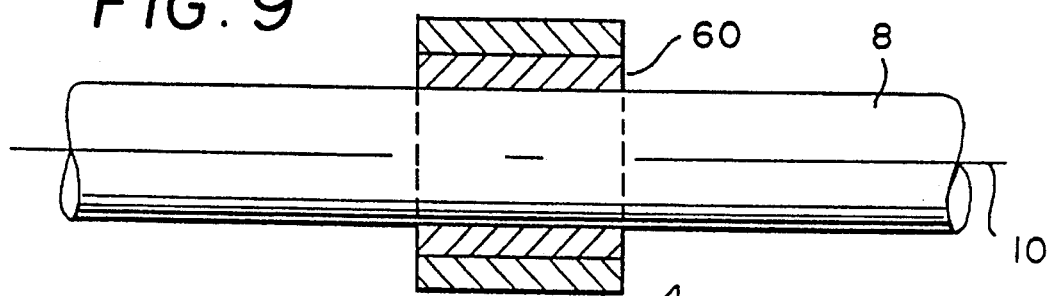
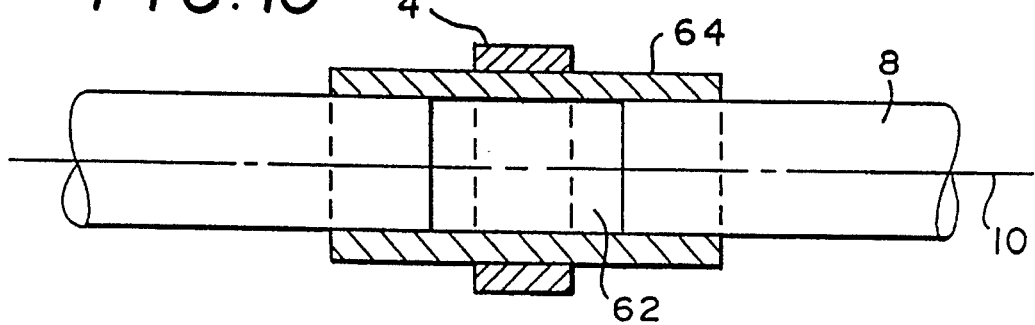

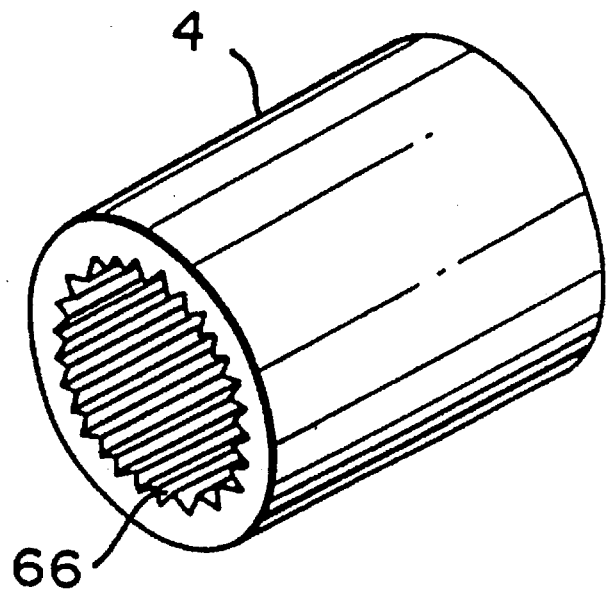
FIG. 11
FIG. 12
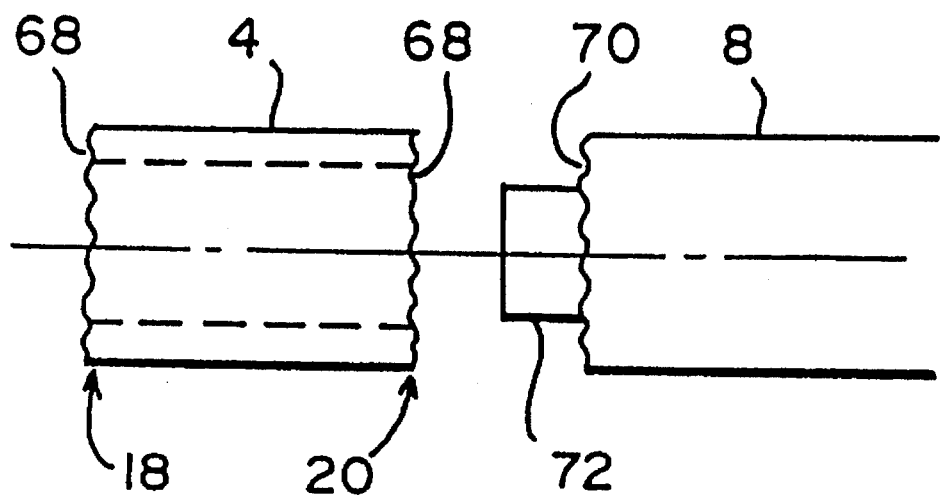

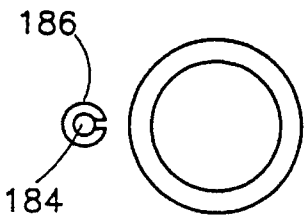
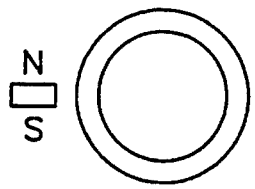
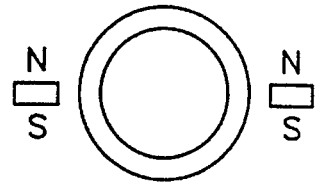
FIG. 38A      FIG. 39A      FIG. 40A
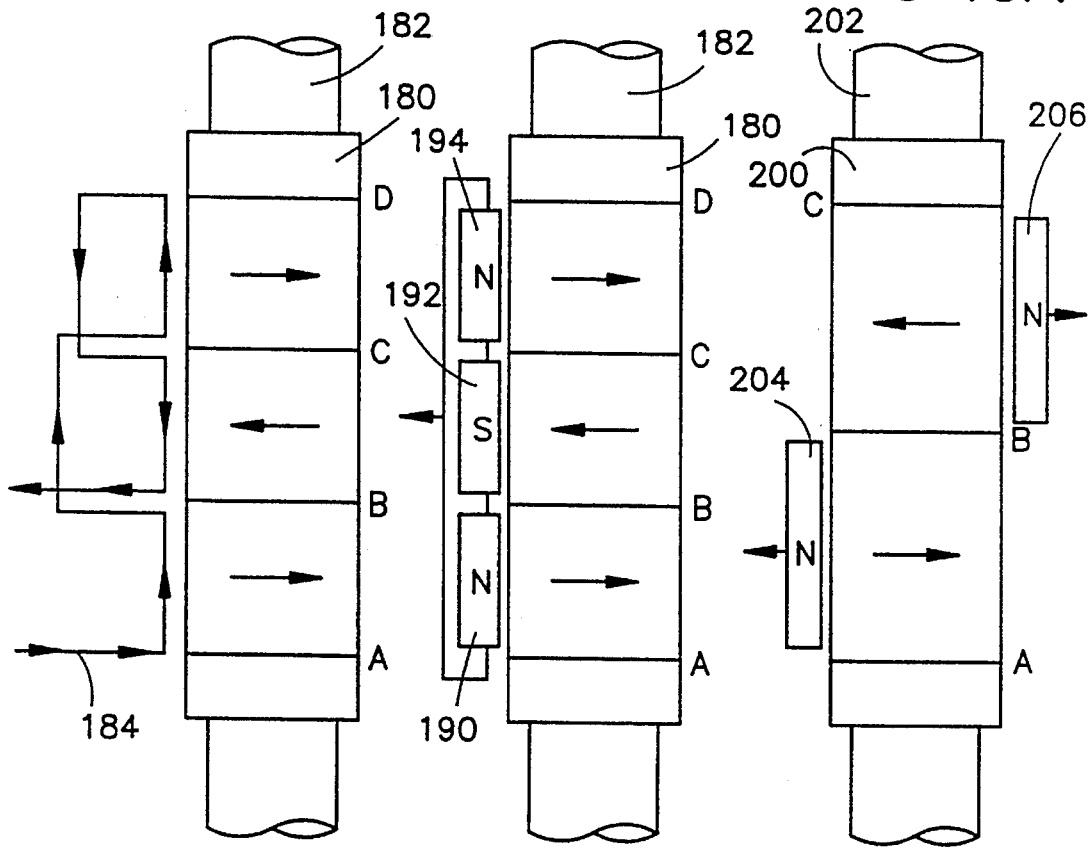
FIG. 38B    FIG. 39B   FIG. 40B

CIRCULARLY MAGNETIZED NON-CONTACT TORQUE SENSOR AND METHOD FOR MEASURING TORQUE USING SAME

CROSS-REFERENCE TO RELATED APPLICATIONS

This application is a continuation-in-part of U.S. application Ser. No. 07/736,299, filed Jul. 29, 1991, now U.S. Pat. No. 5,351,555.

FIELD OF THE INVENTION

The present invention relates to torque sensors and, more particularly, to non-contacting magnetoelastic torque transducers for providing a measure of the torque applied to a shaft.

BACKGROUND OF THE INVENTION

In the control of systems having rotating drive shafts, torque and speed are the fundamental parameters of interest. Therefore, the sensing and measurement of torque in an accurate, reliable and inexpensive manner has been a primary objective of workers for several decades. With the relatively recent development of prototype electric power steering systems in which an electric motor driven in response to the operation of a vehicle steering wheel controls the production torque by control of the supply current thereto, the need for a torque sensing apparatus which can accurately detect a torque produced by a steering shaft has been highlighted. Although great strides have been made, there remains a compelling need for inexpensive torque sensing devices which are capable of continuous torque measurements over extended periods of time despite severe environments and operating conditions.

Previously, torque measurement was accomplished using contact-type sensors directly attached to the shaft. One such sensor is a "strain gauge" type torque detection apparatus, in which one or more strain gauges are directly attached to the outer peripheral surface of the shaft and a change in resistance caused by strain is measured by a bridge circuit or other well known means. However, contact-type sensors are relatively unstable and of limited reliability due to the direct contact with the rotating shaft. In addition, they are very expensive and are thus commercially impractical for competitive use on vehicle steering systems.

More recently, non-contact torque sensors of the magnetostrictive type have been developed for use with rotating shafts. For example, U.S. Pat. No. 4,896,544 to Garshelis discloses a sensor comprising a torque carrying member, with an appropriately ferromagnetic and magnetostrictive surface, two axially distinct circumferential bands within the member that are endowed with respectively symmetrical, helically directed residual stress induced magnetic anisotropy, and a magnetic discriminator device for detecting, without contacting the torqued member, differences in the response of the two bands to equal, axial magnetizing forces. Most typically, magnetization and sensing are accomplished by providing a pair of excitation or magnetizing coils overlying and surrounding the bands, with the coils connected in series and driven by alternating current. Torque is sensed using a pair of oppositely connected sensing coils for measuring a difference signal resulting from the fluxes of the two bands. Unfortunately, providing sufficient space for the requisite excitation and sensing coils on and around the device on which the sensor is used has created practical problems in applications where space is at a premium. Also, such sensors appear to be impractically expensive for use on highly cost-competitive devices such as vehicle steering systems.

The output signals of prior art non-contact magnetoelastic torque transducers arise as a result of changes in a magnetic property of a member which is so positioned as to be mechanically stressed, in a usefully correlative manner, by the torque of interest. In all such prior art devices the magnetic property effectively sensed is a permeability $\mu$, of one form or another. This can be understood from the fact that the output signals of these devices are derived from a magnetic flux density B of a flux which arises in response to an excitation field H with $B=\mu H$. While $\mu$ is clearly alterable by the stress and hence by the transmitted torque, its actual value for any particular stress is largely dependent on both intrinsic and structural properties of the magnetoelastically active material forming the member as well as on its temperature. Moreover $\mu$ is also strongly dependent on H, in a manner that is neither linear nor monotonic. The effective field H is itself sensitive to the amplitude and frequency of the electric currents from which it is generally derived as well as the distribution of permeances of the associated magnetic circuit. Temperature effects on coil resistance, air gap dimensions, leakage flux associated with permeabilities of yokes and other ancillary portions of the magnetic circuit, dielectric constants of parasitic capacitances between windings and other conductive elements and other factors as well, can all have significant influence on the sensed value of B independently of variations in torque. The basic weakness in this prior art approach to magnetoelastic torque transducers is thus seen to be that the sensed quantity, i.e., B, has a large and complex dependence on many variables and a comparatively small dependence on torsional stress with the undesirable result that the sensed variations in B do not unambiguously indicate a variation in torque.

Attempts to overcome this problem with prior art devices employ constructions providing two distinct B dependent signals, having equal quiescent values but opposite responses to torque, with means for combining the two signals differentially; the idea being to reject common mode variations in B while doubling the sensitivity to changes associated with the torque. The requirement for a zero output signal with zero applied torque demands great care in establishing precise symmetry in the two B sensors and precise equality in both the quiescent $\mu$ in the two regions of the member being probed and in the exciting fields. The complexities associated with realizing the sought for benefits of these constructions, in the sensor portion itself as well as in the associated electronic circuits required for providing temperature compensating excitation currents and signal conditioning, increases both the cost and the size of a complete transducer while also generally reducing its adaptability, maintainability and reliability.

SUMMARY OF THE INVENTION

Therefore, it is an object of the present invention to provide a magnetoelastic torque transducer which depends for its operation on the sensing of a quantity that is inherently zero when the torque being measured is zero and which changes in both direction and magnitude in a correlative manner with the torque being measured.

Another object of the invention to provide a magnetoelastic torque transducer in which the zero value of the sensed quantity under zero torque conditions is substantially unaffected by temperature, angular position of a rotating torqued member, its rotational velocity and any radial or longitudinal air gaps between the torqued member and the quantity sensing means.

It is a still further object of this invention to provide a magnetoelastic torque transducer which requires no excitation field.

Yet another object of the invention is to provide a magnetoelastic torque transducer which requires neither exciting currents nor coils.

It is still another object of the invention to provide a magnetoelastic torque transducer comprising a magnetoelastically active portion which has been endowed with an effective uniaxial magnetic anisotropy having the circumferential direction as the easy axis, and magnetically polarized in a substantially circumferential direction.

A further object of this invention is to provide a magnetoelastic torque transducer which requires neither exciting currents nor coils, and in which the sensed quantity is converted into an electrical output signal by solid state devices.

It is also an object of the invention to provide a magnetoelastic torque transducer which requires neither exciting currents nor coils, in which the integrated circuit device includes means for compensating for variations in the transfer function arising from variations in temperature.

Another object of the invention is to provide a magnetoelastic torque transducer which requires neither exciting currents nor coils, in which an integrated circuit device provides compensation for expanding the range over which output is linear.

An additional object of the invention is to provide a magnetoelastic torque transducer which requires neither exciting currents nor coils, is simple, can be constructed at low cost, is suitable for applications requiring extreme reliability, e.g., for sensing the torque input to a steering system of a motor vehicle.

A further object of the present invention is to provide a non-contact method for measuring torque comprising the steps of: attaching to a rotating torqued member a circumferential transducer endowed with an effective uniaxial magnetoelastic anisotropy and magnetically polarized in the circumferential direction, which produces a field varying in response to stress on the transducer, and measuring a component of field output of the transducer as an indication of torque on the rotating torqued member.

Still another object of the invention is to provide a magnetoelastic torque transducer in which the need for shielding structures for avoiding detected magnetic field variation due to ambient fields is minimized or eliminated.

Another object of the invention is to provide a magnetoelastic torque transducer wherein the detected field is substantially insensitive to external magnetic field sources, such as ambient fields.

Yet another object of the invention is to provide a magnetoelastic torque transducer comprising a magnetoelastically active portion which includes two or more axially distinct, magnetically contiguous, oppositely polarized circumferential regions.

A further object of the invention is to provide a method for making a magnetoelastically active transducer having two or more axially distinct, magnetically contiguous, oppositely polarized circumferential regions.

These objects and others are achieved by providing a torque sensor comprising a magnetoelastically active element, and a magnetic sensor, such as a Hall effect sensor, responsive to the field of the magnetoelastically active portion. In the preferred embodiment, the magnetoelastically active portion comprises a ring of material endowed with an effective uniaxial magnetic anisotropy such that the circumferential direction is the easy axis, and magnetically polarized in a substantially circumferential direction. The ring is attached to the torqued member, such as a rotating shaft, so that application of a torque to the shaft is transmitted to the ring. The torque on the ring reorients the circumferential magnetic orientation of the ring, producing a helical magnetic orientation having both circumferential and axial components. A magnetic field vector sensor is mounted in a fixed position relative to the ring and oriented so that it responds to the field arising from the axial component of the magnetization within the ring. The magnetic field vector sensor may be mounted on a flux collector if desired. The output of the sensor is thus proportional to the change in orientation of magnetization in the ring resulting from torque applied to the shaft and transmitted to the ring.

In another embodiment of the invention these and other objects are achieved by providing a torque sensor wherein the magnetoelastically active portion includes two or more axially distinct, magnetically contiguous, oppositely polarized circumferential regions. Each region may comprise a physically separate ring or multiple regions may be formed on a single ring.

BRIEF DESCRIPTION OF THE DRAWINGS

FIGS. 3a through 3g are views of various embodiments of the present invention incorporating a magnetic flux collection yoke;

FIGS. 5a and 5b are graphs showing the effect of an increasing polarizing field on remanent magnetism in the transducer of the present invention;

FIG. 8 is a diagram showing magnetic polarization of the transducer of the present invention by translation of a magnet along the outside of the transducer;

FIG. 9 is a sectional view showing a low permeability spacer installed between the transducer of the present invention and a machine shaft;

FIG. 10 is a sectional view showing a connecting sleeve installed over a cut-away portion of a machine shaft, upon which the transducer is then installed;

FIG. 11 is a perspective view of a transducer having grooves cut on its inner surface in the direction of its longitudinal axis for engaging similar structures on a shaft;

FIG. 12 is a plan view of a transducer having grooves cut on its edges for engaging similar structures on a shaft;

FIG. 38 illustrates one method and apparatus for the simultaneous polarizing of multiple regions on a transducer ring;

FIG. 39 illustrates another method and apparatus for the simultaneous polarizing of multiple regions on a transducer ring; and FIG. 40 illustrates still another method and apparatus for the simultaneous polarizing of multiple regions on a transducer ring.

DETAILED DESCRIPTION OF THE PREFERRED EMBODIMENTS

Figure 1:
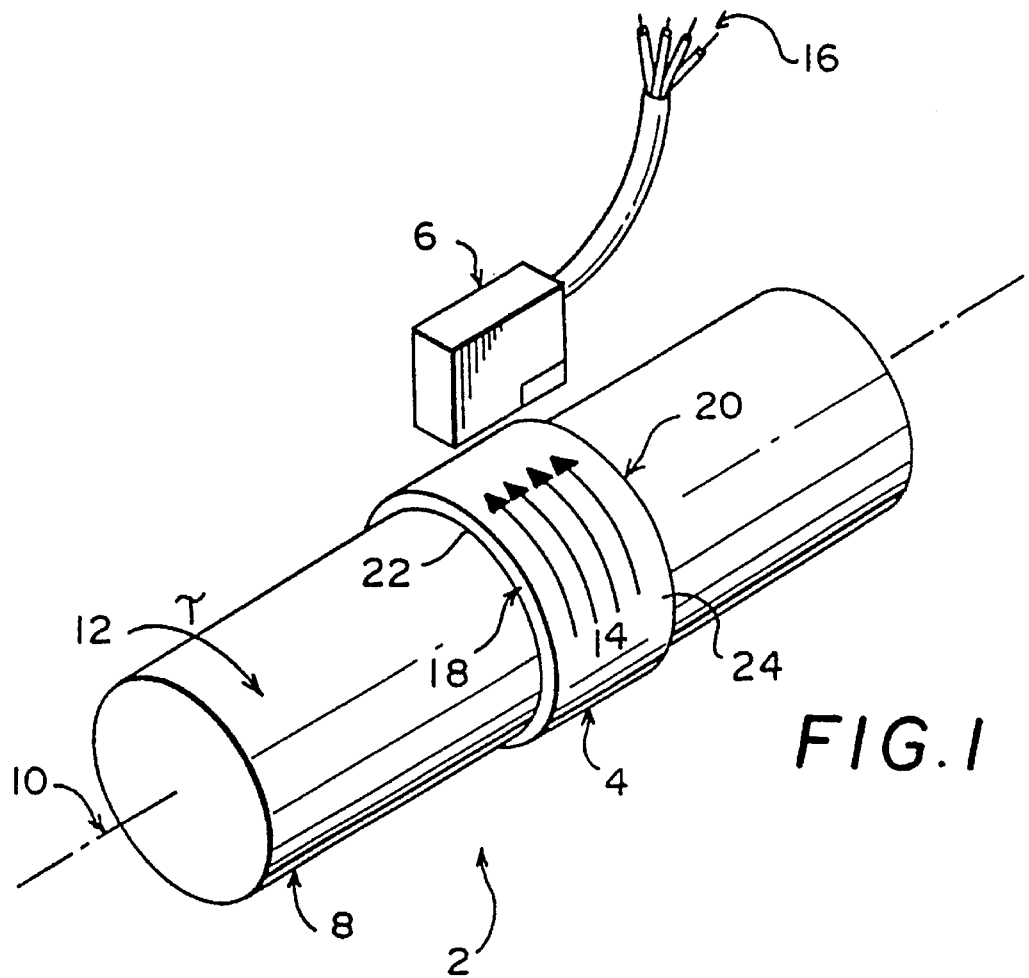
FIG. 1 is an assembly drawing showing the sensor of the present invention.

Referring first to FIG. 1, a torque sensor according to the present invention is shown generally at 2. Torque sensor 2 comprises transducer 4 and magnetic field vector sensor 6. Torque sensor 2 is mounted on a shaft 8 which is part of a machine (not shown) and rotates about a central longitudinal axis 10. Torque 12 is applied at one portion of shaft 8 and is transmitted thereby to another portion of the shaft where the motion of shaft 8 due to torque 12 performs some useful work. Torque 12 is shown as being in a clockwise direction looking at the visible end of shaft 8, but obviously can be applied to rotate the shaft in either or both directions depending on the nature of the machine incorporating shaft 8.

Transducer 4 is firmly attached to shaft 8 in one of a number of ways to be explained in detail later, and acts as a means for providing an axially or radially identifiable, magnetoelastically active region on the shaft 8. In practice, transducer 4 will generally take the form of a cylindrical sleeve or ring with end faces 18 and 20, inner surface 22, and outer surface 24, suitably attached to shaft 8 at a convenient location along axis 10 which is within the torsionally stressed region of shaft 8. Transducer 4 is endowed, by prior processing or as a collateral effect to the means of attachment to shaft 8, with an effective uniaxial magnetic anisotropy having the circumferential direction as the easy axis. In addition, transducer 4 will also be magnetically polarized in one or the other circumferential direction by any effective method, several of which will be later described. Briefly, transducer 4 is magnetically polarized in a substantially purely circumferential direction 14, at least to the extent that, in the absence of torque 12 (in a quiescent state), it has no net magnetization component in the direction of axis 10 and has no net radial magnetization components. Thus, domains whose magnetizations originally had components in the opposite circular sense are substantially eliminated. If the circular anisotropy is suitably dominant, all of the domain magnetizations will lie within at most a plus or minus 45° limit, and will be symmetrically distributed within small enough volumes of the ring to ensure that no uncompensated external flux is sensable by magnetic field vector sensor 6. The closed cylindrical shape of transducer 4 enhances the stability of the polarization of transducer 4 by providing a complete circuit.

As will be seen, due to the construction and processing of transducer 4, application of torsional stress to shaft 8 and thus to transducer 4 causes reorientation of the polarized magnetization in the transducer 4. The polarized magnetization becomes increasingly helical as torsional stress increases. The helicity of the magnetization in transducer 4 depends on the magnitude of the transmitted torque 12, and the chirality is dependent on the directionality of the transmitted torque and the magnetoelastic characteristics of transducer 4. The helical magnetization resulting from torsion of transducer 4 has both a circumferential component in direction 14 and an axial component along axis 10. Of particular importance is that the magnitude of the axial component depends entirely on the torsion in transducer 4.

Magnetic field vector sensor 6 is a magnetic field vector sensing device located and oriented relative to transducer 4 so as to sense the magnitude and polarity of the field arising in the space about transducer 4 as a result of the reorientation of the polarized magnetization from the quiescent circumferential direction to a more or less steep helical direction. Magnetic field vector sensor 6 provides a signal output reflecting the magnitude of torque 12. In a preferred embodiment, magnetic field vector sensor 6 is an integrated circuit Hall effect sensor. Wires 16 connect magnetic field vector sensor 6 to a source of direct current power, and transmit the signal output of magnetic field vector sensor 6 to a receiving device (not shown), such as a control or monitoring circuit for the machine or system incorporating shaft 8.

Because of symmetry in the case of domains of transducer 4 which are not precisely circumferentially polarized, and because of the pure circularity of other magnetic orientation in other domains, there is no sensable field in the space external to the quiescent, untorqued transducer 4. Indeed, there is no passive external means of discerning that the transducer 4 is in fact polarized. The action of the biaxial principal stresses associated with the transmission of torque, via the intrinsic magnetoelastic interaction of the material of transducer 4, adds an additional anisotropic influence to the equilibrium orientation of each domain's magnetization, altering the effective easy axis direction of every domain towards the nearest positive principal stress (the stress being tensile in materials with positive magnetostrictions, and compressive in materials with negative magnetostrictions). The original symmetry or pure circularity of the magnetization is thus broken by the application of torque so that a net helicity appears in the magnetization within transducer 4. This helicity, combined with the single circular sense of the polarization, results in a magnetization that may be resolved into two components: a circumferential component and an axial component. While the circumferential component is, as has already been mentioned, not a source of detectable fields in the space external to the transducer 4, the axial component can be readily detectable. Transducer 4, when torqued, generates a field externally indistinguishable from that of a tubular bar magnet, with the bar magnet's axial magnetization equal to the volumetrically averaged axial component of the helically directed magnetization of each domain. Thus, the direction of applied torque determines (together with the sign of the effective magnetostriction of the transducer 4 material) the polarity of the equivalent bar magnet, and the magnitude of the torque determines the strength of the equivalent bar magnet.

Referring now to FIG. 3a through 3g, in the preferred embodiment, a yoke 26 of magnetically soft (low coercive force, high permeability) material is provided in conjunction with the magnetic sensor or sensors 6. Yoke 26 is a means for increasing the permeance of the flux closure path through the magnetic field vector sensor 6, and is also a means for collecting flux from circumferential portions of transducer 4 which are farther from magnetic field vector sensor 6. The yoke 26 is particularly useful with Hall effect integrated circuits, since these devices tend to have relatively high noise levels, increasing with decreasing frequency. Thus, it is preferable to operate these devices using higher rather than lower field strengths to increase the S/N (signal/noise) ratio.

Figure 3A:
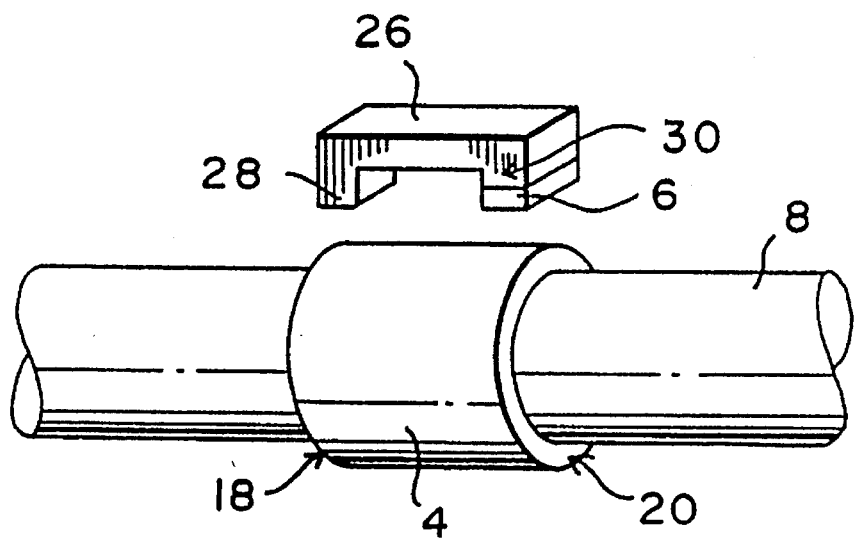

As shown in FIG. 3a, magnetic field vector sensor 6 is preferably located near the edge 18 (or edge 20) of transducer 4, since the orientation of the magnetic field from transducer 4 dictates that greater field intensity will be present near the edges 18 and 20 of transducer 4 than in other regions proximate to transducer 4. In this embodiment, yoke 26 is a generally bar-shaped flux collector disposed on one side of transducer 4 and shaft 8. Yoke 26 has projections 28 and 30 at its ends proximate to edges 18 and 20 of transducer 4. Magnetic field vector sensor 6 is mounted on projection 30 between yoke 26 and transducer 4.

Figure 3B:
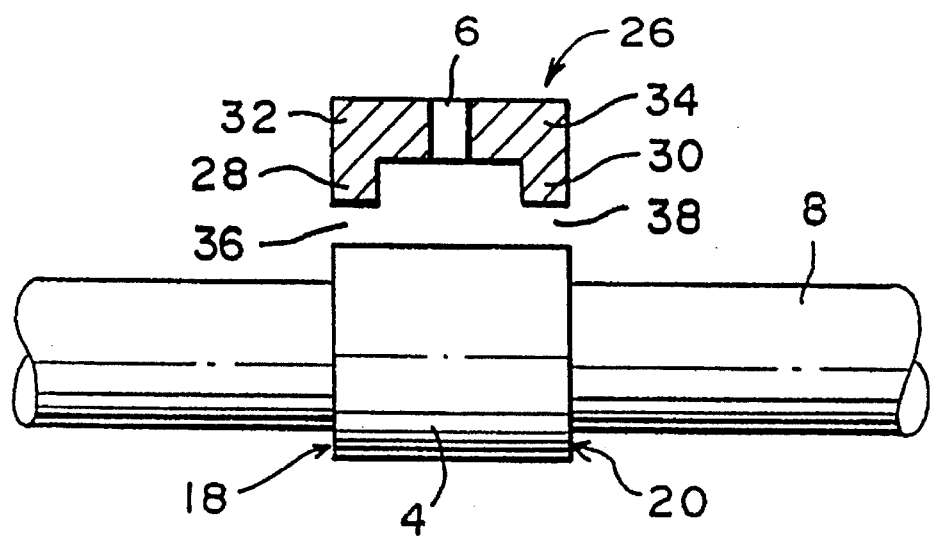

FIG. 3b shows a yoke 26 composed of two segments 32 and 34, with projections 28 and 30 respectively extending toward transducer 4. Magnetic field vector sensor 6 is located axially (with respect to shaft 8) between yoke segment 32 and yoke segment 34, completing a magnetic path from edge 18 of transducer 4 through air gap 36, yoke segment 32, magnetic field vector sensor 6, yoke segment 34, air gap 38, to edge 20 of transducer 4.

FIG. 3c shows another embodiment of yoke 26, generally similar to the embodiment of FIG. 3b, in which magnetic field vector sensor 6 is located radially between yoke segments 32 and 34; that is, the magnetic path passes from yoke segment 32 radially outward with respect to shaft 8, through magnetic field vector sensor 6, and further radially outward to yoke segment 34.

FIG. 3d is a top view of another embodiment of yoke 26. The embodiment of FIG. 3d is similar to the embodiment of FIG. 3c, but in this embodiment yoke segments 32 and 34 are bar-shaped and are aligned proximate to the outer surface 24 of transducer 4, along different central axes, each axis parallel to axis 10 of shaft 8. Magnetic field vector sensor 6 is located between the ends of yoke segments 32 and 34. Thus, the path from yoke segment 32 to yoke segment 34 through magnetic field vector sensor 6 is circumferential about transducer 4 and shaft 8, and transverse to the central longitudinal axes of yoke segments 32 and 34.

FIG. 3e shows yet another embodiment of the present invention in which two magnetic sensors 6 are used. The magnetic sensors 6 are disposed at opposite ends of transducer 4, near edges 18 and 20 respectively, and are connected by a simple bar-shaped yoke 26. Multiple sensor embodiments increase the cost of the device, but are desirable because the magnetic sensors 6 can be connected differentially for common mode rejection of temperature variations, voltage variations, and ambient field signals. Optionally, to minimize ambient field effects, magnetic sensors 6 may be shielded by a shield 39, made of any material having very low magnetic permeability. Shield 39 may surround magnetic sensors 6 in all directions other than the direction of flux received from transducer 4.

Of course, a larger number of magnetic sensors 6 could also be used if desired. In the embodiment shown in FIG. 3f, four magnetic sensors 6 are used, with two disposed diametrically opposite to the other two with respect to transducer 4.

Figure 3G:
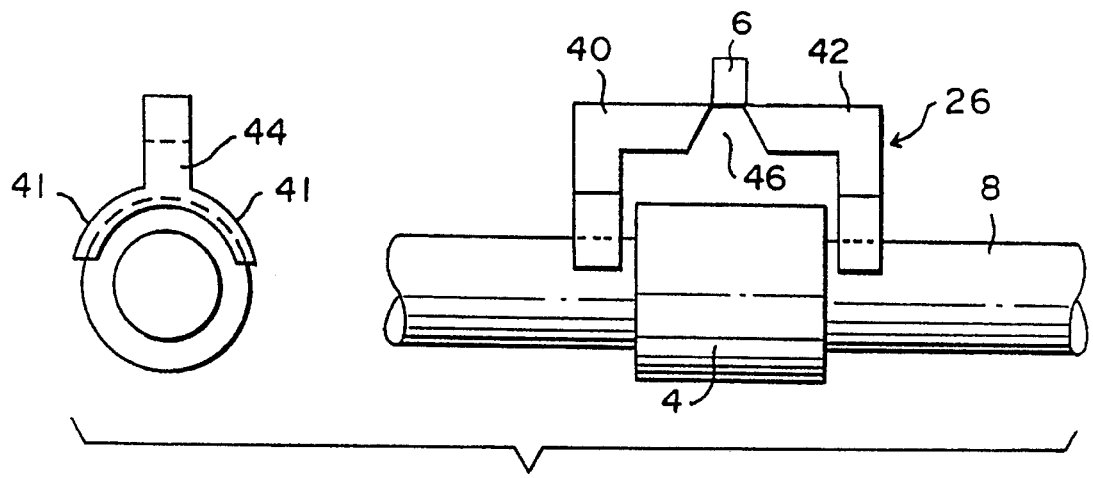

FIG. 3g shows yet another embodiment of the sensor 2 of the present invention. In this embodiment, yoke 26 is made up of two right-angle bar-shaped segments 40 and 42. Legs 44 of segments 40 and 42 terminate proximate to the shaft 8 in the region of edges 18 and 20 of transducer 4. At their terminations, legs 44 join a circumferential portion 41 of yoke 26. Circumferential portions 41 may surround part or all of the shaft 8 and gather flux from a circumferential region. The flux is led up a leg 44 to a small tapered air gap 46 where "fringing" flux is directed through magnetic field vector sensor 6 to the other of segments 40 and 42. Gap 46 is preferably on the order of a few thousandths of an inch, or less, across at its narrowest point, thus providing an intense field in the region. While this gap is axial, similar arrangements could also use gaps oriented radially or circumferentially with respect to transducer 4.

The yokes 26 shown in FIGS. 3a through 3g perform several useful functions. Besides concentrating the flux gathered from a larger area and directing it to or through magnetic field vector sensor 6, yokes 26 reduce the effects of any inhomogeneity in the axial magnetic moment which might exist at different circumferential locations around the transducer 4. In extreme cases of such inhomogeneity or radial runout (eccentricity) of the shaft it may also be desirable to provide a yoke 26 that fully encircles transducer 4. Such a yoke might be made from coaxial rings of soft magnetic material near each end of, but radially separated from, transducer 4. The flux gathering pieces would be firmly attached (with minimum interfacial gaps) to other pieces of yoke 26 configured to lead the gathered flux to the magnetic field vector sensor 6.

Experimentation with the polarized transducer 4 according to the present invention suggests that its magnetic properties are stable over time, temperature excursions, vibration (stress in various modes) and continued torque cycling. In particular, the polarized transducer 4, with its closed ring shape, is in the lowest possible energy state and therefore the most stable state. In the demagnetized condition, there is potential energy in the domain walls as well as in local stresses due to "misfit" of domains having non-coherent spontaneous magnetostrictions and in the microscopic fields in the vicinity of regions where the local magnetization changes direction.

Figure 4:
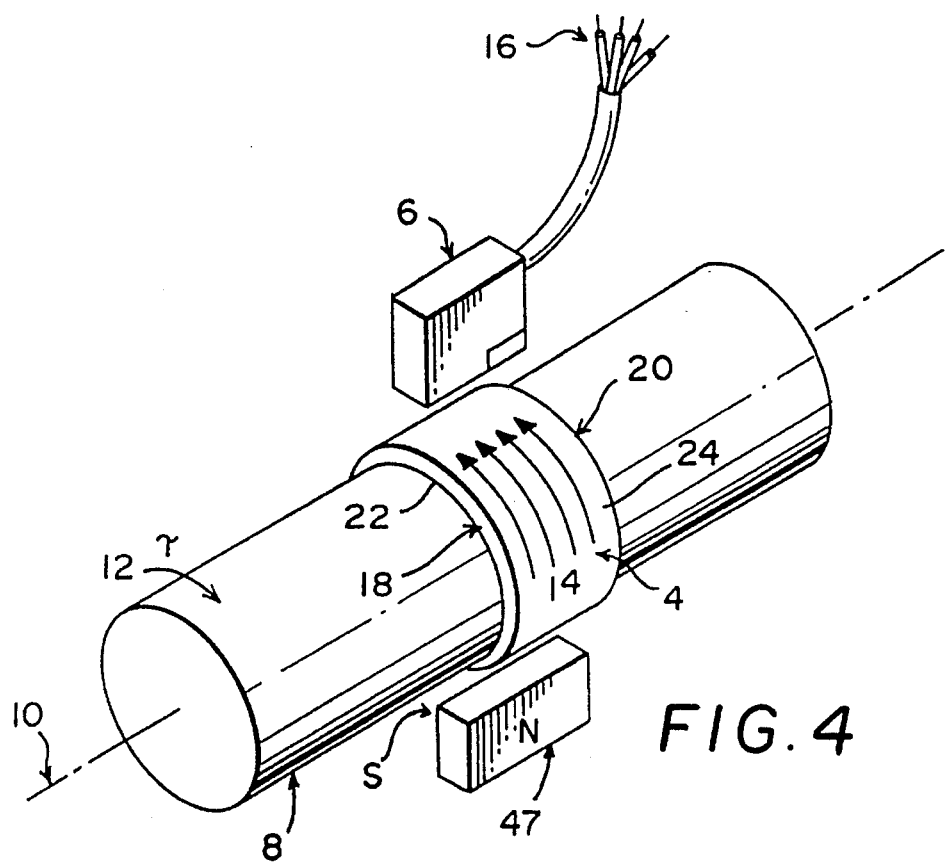
FIG. 4 is an assembly drawing showing a refresh magnet installed for use in conjunction with the sensor of the present invention.

Should any problem be encountered with long-term stability of the fields generated by transducer 4, a fixed refresh magnet 47 can be provided in the machine or system proximate to the rotating transducer 4, as illustrated in FIG. 4. Addition of this magnet component provides a continual low-level magnetic force on transducer 4 which tends to maintain the desired polarization of transducer 4. Magnet 47 can be relatively weak since it need not be strong enough to actually polarize the entire transducer 4, but must only be able to correct any wayward domains which develop during extended operation of the device in the field. A small bonded ferrite magnet 47 with length approximately equal to the length of transducer 4 along axis 10 and magnetized across its thickness (with N pole on one face and S pole on the other as shown) can be used.

MAGNETIC SENSOR CONSTRUCTION

Magnetic field vector sensor 6 preferably comprises one or more solid state sensing devices, such as Hall effect, magnetoresistance, magnetotransistor ("magnistor"), magnetodiode, or MAGFET (Magnetic Field Effect Transistor) sensors. Other possible sensors include non-linear cores, having magnetic properties varying with H, magnetometers, flux gate magnetometers, and coils (either encircling or proximate, intercepting flux and having an induced EMF proportional to $d\phi/dt$).

Figure 2:
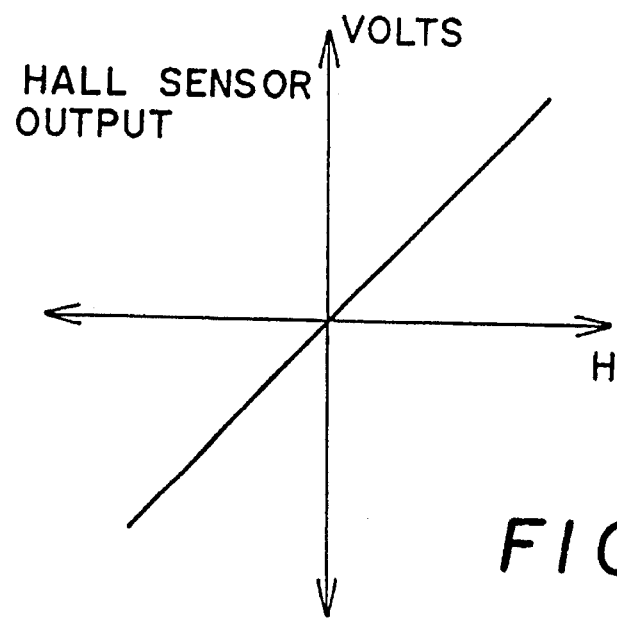
FIG. 2 is a graph showing the linear transfer function of a Hall effect sensor used in the present invention.

The solid state sensors are preferred in this application because of their small size and low cost, and because they can incorporate in an integrated package desirable electronics for temperature compensation, signal conditioning, voltage regulation, and other operational functions. Hall effect sensors are particularly preferred because, as shown in FIG. 2, they have an ideal transfer characteristic which is both linear and polarity-sensitive. Some integrated circuit Hall Effect sensors suitable for use as magnetic field vector sensor 6 are Model TL173C made by Texas Instruments, Model No. AD22150 made by Analog Devices, Models UGN3503U and UGN3503UA made by Allegro MicroSystems, Inc. Similar, potentially suitable devices are also manufactured by MicroSwitch, Siemens, and Wolff Controls Corporation.

Magnetic field vector sensor 6 is located and oriented to produce a maximum response to the external field arising with the transmission of torque. Following from the equivalence of the torqued transducer 4 and an axially magnetized bar magnet, the most intense fields will be found near the poles, i.e., near end faces 18 and 20 of transducer 4. Magnetic field vector sensor 6 is preferably fixed proximate to shaft 8 and does not rotate. Since most major applications of torque transducer involve rotating torqued members such as shaft 8, magnetic field vector sensor 6 must be radially separated from shaft 8 to avoid physical contact with shaft 8 as shaft 8 rotates. While the precise location and orientation of the magnetic field vector sensor 6 will depend on its particular operating principle, package size, active area and other details of construction as well as geometric and magnetic characteristics of transducer 4 (e.g., sharpness of corners, radial thickness, axial length, diameter) and the required radial space, an approximately optimum location for magnetic field vector sensor 6 will usually be found radially outward from one of the end faces 18 and 20, oriented to sense radial flux.

The magnetic field vector also varies in direction in the space around transducer 4. Recognizing that sensors 6, e.g., Hall effect devices, have a unique sensing axis, it becomes possible to orient the sensing device in an advantageous manner relative to the shaft axis. When the sensor 6 is advantageously oriented, the fall off in field intensity (H) with increasing distance from the transducer 4 is compensated by an increasing sensitivity of the field sensor 6 to the field vector as the direction of the field vector becomes more closely aligned with the orientation of the sensing axis. Stated otherwise, if $\Theta$ is the angle between the unique sensing axis of sensor 6 and the field vector, and the output of sensor 6 is proportional to $H\cos\Theta$, although H may diminish with distance from the transducer ends, as long as $\Theta$ also diminishes (i.e., the sensing axis and field vector directions are made to coincide), $\cos\Theta$ increases to offset the decrease in H. Thus the need for precise radial gap control between the transducer 4 and sensor 6 is alleviated.

A major advantage of the present invention lies in the fact that any circumferential inhomogeneity occurring in transducer 4 is of much smaller magnitude compared, for example, with inhomogeneity in prior art torque transducers using local sensors. Such sensors sense only a small local region (a spot) on the shaft surface, while the magnetic field vector sensor 6 used here senses the axial field from a region extending the full axial length of the transducer 4. Thus, magnetic field vector sensor 6 averages local moments developed from the many domains along a line, rather than sensing a single point on a line.

Another significant advantage of the sensing in the present invention is that the field sensed by magnetic field vector sensor 6 is modulated only by the direction and magnitude of the transmitted torque. Under conditions of steady torque there is no temporal variation in this field. Thus, unlike the great majority of prior art torque transducers in which the sensed flux is cyclically driven by an alternating polarity, high frequency magnetomotive force, the torque information from the subject transducer resides entirely in the instantaneous flux density, and not in features of a periodic wave carrier or its time rate of change. This allows the use of solid state magnetic sensors 6 which provide electrical outputs proportional to B (flux density) or H (field intensity), since sensor 6 is in an air gap where $\mu$ (permeability)=1. Solid state magnetic sensors are smaller, structurally simpler, and less expensive than coil-type field sensors.

As noted previously although it is an advantage of the present invention that coils are not required, magnetic sensors 6 using coils can be used with transducer 4 in appropriate applications. Small, flux gate (saturable core) or similar types of field sensors can be used, especially where environmental conditions are too extreme for currently available solid state devices. Flux linkage types of field sensors are also usable but, since these will require integrator circuits to change the $d\phi/dt$ signal to $\phi$, they are less preferred.

TRANSDUCER CONSTRUCTION

The construction of an effective transducer 4 according to the present invention requires proper dimensioning, proper material selection, and proper orientation of magnetization in transducer 4.

First, exemplary dimensioning of transducer 4 will be discussed in detail. In one illustrative and preferred example, for a ½" diameter shaft, transducer 4 may be ½" long along its central longitudinal axis, of 18%-Ni maraging steel (T-250), with a 0.499 to 0.498 inch central hole to provide a force fit on shaft 8, and with wall thickness in the 0.030–0.050 inch range. However, the dimensions of transducer 4 may vary in particular application, according to the following general precepts.

A relatively thin wall thickness is usually desirable for transducer 4. The stress in transducer 4 will vary linearly from zero at the center (if transducer 4 is a solid cylinder) or some larger value at inner surface 22 to a maximum at outer surface 24. It would be possible to make a transducer 4 in the form of a solid cylinder, which could be interposed in a break in shaft 8. However, a solid cylindrical transducer 4 would use material inefficiently both mechanically and magnetically. Not only would the center portion transmit little torque, but also the gradient in the axial magnetization component, which is highest on the surface, means that some surface flux would be diverted in an attempt to more axially magnetize the inner material, reducing the amount of flux available for measurement by magnetic field vector sensor 6.

At the other extreme, if transducer 4 is too thin there will be an insufficient volume of material contributing to the external magnetic field. The field is proportional to the magnetic moment from which it arises and the magnetic moment=MV, where M is the axial component of magnetization and V is the volume of material so magnetized.

The axial length of transducer 4 will depend in part on the thickness of the shaft. A cylinder with its axial length disproportionately smaller than its diameter will be difficult to assemble onto and attach to shaft 8. For example, if the transducer 4 is held on the shaft by an interference fit, the fit can be tighter if the transducer 4 is thicker and longer.

If the axial length is too short, the field resulting from the axial component of magnetization will be non-uniform and difficult to sense. As noted previously, the torsionally stressed transducer 4 produces an equivalent field to that of a bar magnet having a pole at each end. The closer these poles are to each other, the more intense is the internal "demagnetizing field" of the magnet. There are three energy terms influencing the orientation of magnetization of transducer 4: (1) anisotropy of the material tends to keep the magnetization circumferential; (2) magnetoelastic forces tend to align magnetization in a 45° helix; and (3) the demagnetizing field tends to reduce the axial component of the magnetic field.

The demagnetizing field increases with the axial component of magnetization. Thus, the demagnetizing field grows as magnetoelastic forces overcome the anisotropic forces. The demagnetization factor (a number generally falling between 0 and 4*PI) grows with decreasing axial length and (not as quickly) with increasing thickness. At the other extreme, if the transducer 4 is overly long, a much larger external magnetic structure will be required to close the magnetic circuit through a local field sensor. For small shafts, a width roughly equal to the diameter of the shaft is a good starting point for the design.

Material selection for making transducer 4 is critical, and materials should be selected by matching properties of available materials with the performance requirements of the transducer application and in conjunction with selection of the materials for shaft 8. In the most preferred embodiment, the transducer 4 is constructed of nickel maraging steel such as 18% nickel maraging steel.

The material selected must be ferromagnetic to assure the existence of magnetic domains and must be magnetostrictive in order that the orientation of the magnetization may be altered by the stresses associated with an applied torque.

Materials other than nickel maraging steel may also be appropriate depending on the characteristics of the application. Materials should be chosen in view of the following general criteria.

In the transducer application, the field which arises with the torque is due to the discontinuity in the axial component of magnetization at the two ends of the active region. These ends effectively become the poles of a bar magnet. This field will increase with the saturation magnetization, $M_s$, of the active material. The larger that $M_s$ becomes, the larger the discontinuity. Formally, $divH=-divM=$(in the limit)$-0.7071 divM_s$), where $0.7071=\sin 45°$.

The polarization is maintained against disturbing fields by the quiescent anisotropy $K_u$. Therefore, a larger $K_u$ is preferable. However, the magnetization is reoriented by stress more easily (requiring less torque) when $Lambda_s/K_u$ is large, where $Lambda_s$ is the saturation magnetostriction. Therefore, if high sensitivity is desired, $Lambda_s$ should be large relative to $K_u$. If a large dynamic range is desired, $Lambda_s/K_u$ should be small enough for $3(Lambda_s)(Sigma)/K_u$ to stay within the linear range at the highest required torque.

Other materials that substantially fulfill these criteria and therefore may be used to construct transducer 4 include the following:

Other nickel maraging steels.

Other nickel-iron alloys, including both binary alloys and steels. The binary alloys must include higher nickel (40%–50%) alloys, while steels may include 9-4-20 or AISI 9310.

Aluminum maraging steels that typically contain 13% aluminum, such as Alfer (13% Al-Bal Fe).

Manganese maraging steels that have the advantage of being less expensive than nickel maraging steels.

Permendur type alloys, such as 49Co 49Fe 2V, with very high magnetostriction. Vanadium can be added to make the material easier to work with and to increase its strength. Similar alloys with a lower cobalt content may be used.

Martensitic stainless steel, including straight chromium types such as 410, 416 or 440.

Ferritic stainless steel, such as AISI 430.

Precipitation hardening stainless steel, such as 15-5 PH or 17-4 PH.

Amorphous and nanocrystalline materials.

Transducer 4 can be constructed in its basic shape from the selected material by any suitable material working process. Following formation of transducer 4, two steps are performed to impose the desired circumferential magnetic field orientation on the material of transducer 4. First, transducer 4 is endowed, by prior processing or as a collateral effect of its attachment to shaft 8, with an effective uniaxial magnetic anisotropy having the circumferential direction as the easy axis. Second, transducer 4 must be polarized in one or the other circumferential direction.

The first step in setting up the required magnetic field orientation is to impose circumferential quiescent magnetic anisotropy on the structure of transducer 4. To obtain efficient use of all of the magnetic domains, i.e., the entire volume of transducer 4, the quiescent anisotropy in each should not depart more than 45 degrees from the circumferential direction. For every magnetic domain to work with equal effectiveness and symmetrically for both clockwise and counterclockwise torque, they should all be purely circular, i.e., precisely in the circumferential direction. However, absolute perfection in this regard is not required to obtain good operating results; it is necessary only that the magnetic orientation in each domain be within 45 degrees of ideal.

Magnetic anisotropy is preferably produced by physical working of the material of transducer 4. Any physical source of magnetic anisotropy can be used, alone or in combination, to attain the desired distribution of quiescent domain orientations, being circumferential within plus or minus 45°. One source of magnetic anisotropy is magnetocrystalline i.e., "crystal anisotropy," which refers to the preferred orientation of the magnetic moments ("spins") of the atoms (ferromagnetic atoms) in directions correlated with the axes which define the crystal structure. A second source of magnetic anisotropy is directional order, which refers to the distribution of atomic species, lattice defects, inclusions (exclusions) or other chemical or structural features found in one direction (or more than one, but not all). A third source of magnetic anisotropy is magnetoelastic, which is associated with the directionality of stress in materials having a spontaneous magnetostrictive strain correlated with their spontaneous magnetic moment (magnetostriction-ferromagnetic). A fourth source of magnetic anisotropy is shape of the material, which is associated with the divergence of M at material boundaries. Specifically, a demagnetizing field arises from the "poles" of a magnetized body, and is more intense if the poles are closely spaced. Shapes other than spherical shapes inherently have some axes which are magnetically "easier" than others.

Any or all of these physical sources of anisotropy can be used in constructing transducer 4. As an example, crystal texture arises from various combinations of mechanical working and heat treating. Mechanical working, such as rolling, tends to align the crystals since they have anisotropic strengths and stiffnesses. Thus, the desired magnetic anisotropy could be introduced by cold rolling transducer 4 between two closely spaced working rollers rotating about axes parallel to the central longitudinal axis of transducer 4. Another method of achieving the desired anisotropy would be to construct transducer 4 by mechanically rolling a continuous, narrow strip of the material of transducer 4 in its longitudinal direction, and then forming transducer 4 by spirally wrapping the strip about shaft 8 using an adhesive to hold the strip in place. Subsequent heat treatment of previously rolled materials causes recrystallization, with crystal growth in directions reflecting the rolling direction, so that the desired anisotropy is enhanced. As another example, the outer surface 24 of transducer 4 can be rolled (or machined) to have a series of circumferential ridges and troughs (a circumferential knurl) in order to develop shape anisotropy (with or without stress anisotropy).

While the aforementioned methods may be particularly useful in certain applications, a preferred embodiment of the invention provides that the transducer 4 be assembled to the shaft with a "press fit," "shrink fit," or other type of "interference fit" wherein the inside diameter of the transducer 4 is made smaller than the outside diameter of the shaft at the interface. This construction places the transducer 4 into circumferential tension (referred to as "hoop stress"). If the transducer 4 is fabricated from a material having a positive magnetostriction, this tensile stress will inherently provide the desired circular anisotropy. This method is particularly advantageous since the magnetic anisotropy can be generated as an inherent function of machine assembly, eliminating the need for a prior processing step to establish directional magnetic anisotropy in transducer 4.

In a particularly preferred process, the inside diameter of transducer 4 and/or the outside diameter of shaft 8 can be "adjusted" after assembly to obtain this hoop stress condition, as long as suitable materials are chosen for transducer 4 and/or shaft 8. If transducer 4 is made from maraging steel it will shrink during the aging process. Similarly, if shaft 8 can be made to undergo a martensitic conversion, as by quenching from an elevated temperature, shaft 8 will expand. If the martensite is only moderately tempered, it will remain magnetically hard and thus have a low permeability as required for shaft 8. This shrink-fit of the transducer 4 to shaft 8 inherently produces circumferential hoop stress in transducer 4 which together with its positive magnetostriction provides the desired magnetic anisotropy.

Circumferential anisotropy based on maintaining the transducer ring under stress can be obtained by axial or radial compression as well as by circumferential tension (i.e., "hoop stress"). While hoop stress creates an unambiguous circumferential easy axis, the same is not true with orthogonal compression alone. Thus, with axial compression the energetically preferred magnetization orientation is at 90° from the shaft axis, an orientation met equally well by either radial or circumferential magnetization. It is the combination of this axial compressive stress anisotropy with the shape anisotropy of a thin ring which favors the circumferential over the radial orientation. With radial compression, shape anisotropy alone may not provide enough protection from the magnetization falling into an axial orientation, especially in the presence of suitably large axial fields. Some axial compression and/or circumferential tension, in addition to the radial compression, would be useful to ensure the stability of the circumferential magnetization orientation.

Axial compression is easily secured and maintained with various threaded arrangements or with wedges, etc. or by temporarily applying external compressive forces to the transducer ring and pinning or otherwise locking collars, or similar members, to the shaft to maintain the ring in compression after the externally applied forces are removed. In any case, the compressive stress is maintained in the magnetoelastically active region (e.g., the transducer ring by elastic stresses in contacting parts of the assembly). Some simple methods for maintaining the ring under axial compression are shown in FIGS. 17 and 18.

Figure 17:
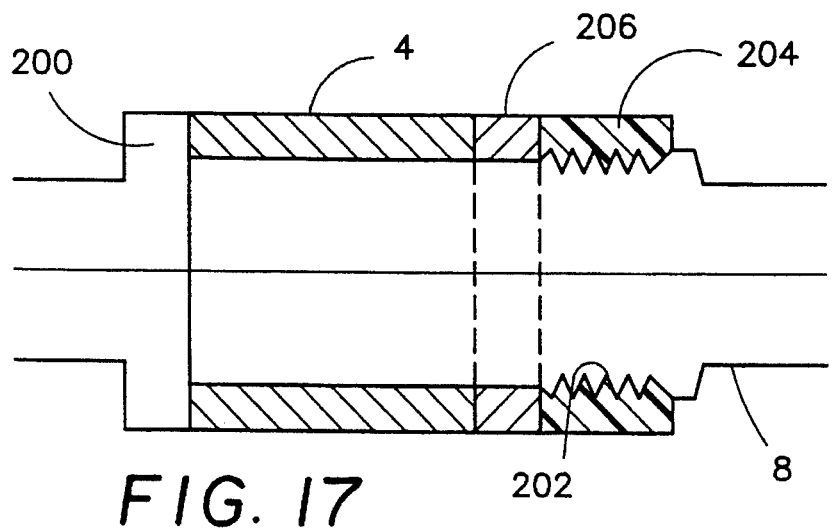
FIG. 17 is a sectional view showing one arrangement for applying axial compression to the transducer ring.

In FIG. 17, transducer ring 4 is mounted on shaft 8 with one end of the ring abutting shaft shoulder 200 and the other end terminating adjacent an externally threaded portion 202 of shaft 8. An internally threaded nut 204 threadably engaged on shaft threaded portion 202 is used to place ring 4 in axial compression by threadably advancing nut 204 toward ring 4, thereby compressing washer 206 against ring 4.

Figure 18:
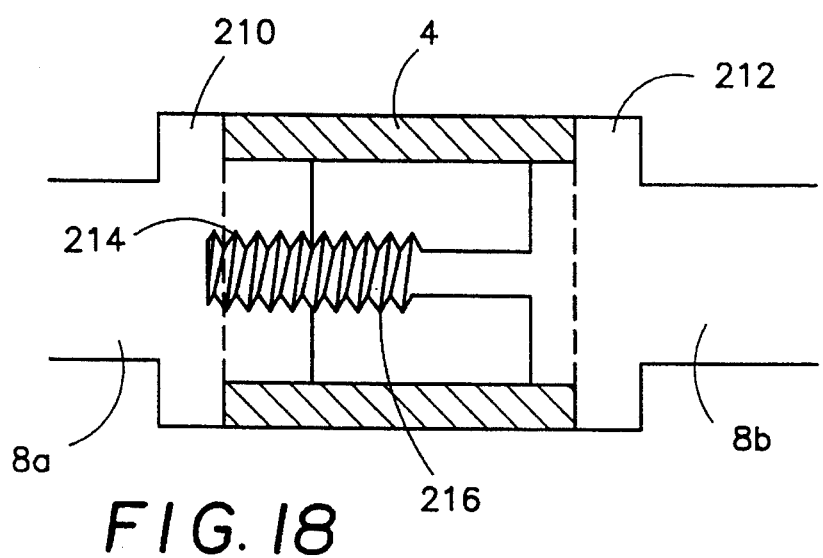
FIG. 18 is a sectional view showing another arrangement for applying axial compression to the transducer ring.

In FIG. 18, transducer ring 4 is mounted between shoulders 210, 212 of shaft pieces 8a and 8b. Shaft piece 8a includes an internally threaded bore 214 which is adapted to receive externally threaded stud 216 of shaft piece 8b. As stud 216 threadably engages within bore 214, transducer ring 4 is axially compressed between the shoulders 210, 212 of the shaft pieces.

An alternative arrangement for axially compressing transducer ring 4 is to employ a turnbuckle arrangement in which a separate stud piece having LH and RH external threads at its respective ends engages with a correspondingly internally threaded bore in each of the shaft pieces. The compressive stress in the ring is developed by tightening the engaging threaded members.

Figure 19:
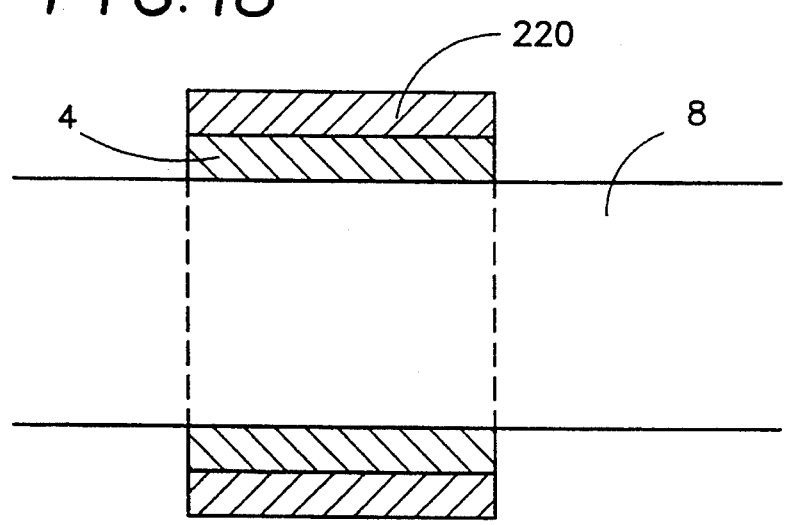
FIG. 19 is a sectional view showing an arrangement for applying radial compression to the transducer ring.

Transducer ring 4 may be placed under radial compression by various external clamping means, e.g., radially inwardly pressing a tight fitting sleeve or similar hollow member over it. A shrink fitted member may also be used. A particularly attractive method for shrinking a sleeve over the ring uses the dimensional variation accompanying a metallurgical phase change, e.g., the martensitic transformation in a Shape Memory Alloy such as Nitinol. FIG. 19 illustrates this method wherein shrink fit sleeve 220 places transducer ring 4 in radial compression by shrinking radially inwardly over ring 4 on shaft 8.

Following the introduction of magnetic anisotropy to transducer 4, transducer 4 must be polarized in the desired direction, either clockwise or counterclockwise about the circumference of transducer 4. Polarizing the transducer 4 (or more generally, the active element) requires the exposure of all portions to a large enough field in the desired circular direction. The required size of the polarizing field is limited by the practical attainment of saturating effects. Use of a larger field does not noticeably change the operation of the properly polarized device. Transducer 4 should be exposed to the field for a sufficient period of time for the desired polarizing effects of the field to take place, for eddy currents to die down, and so that nothing more happens if the field is maintained for a longer time. FIG. 5a illustrates the effect of increasing the polarizing field from point A to B to C to point D, and the resulting increase in remanent magnetism $M_R$ from A to B to C to D. As shown in FIG. 5b, at some level $H=H_{SAT}$, $M_R$ becomes effectively saturated so that further increasing H produces no additional increase in $M_R$.

Figure 6:
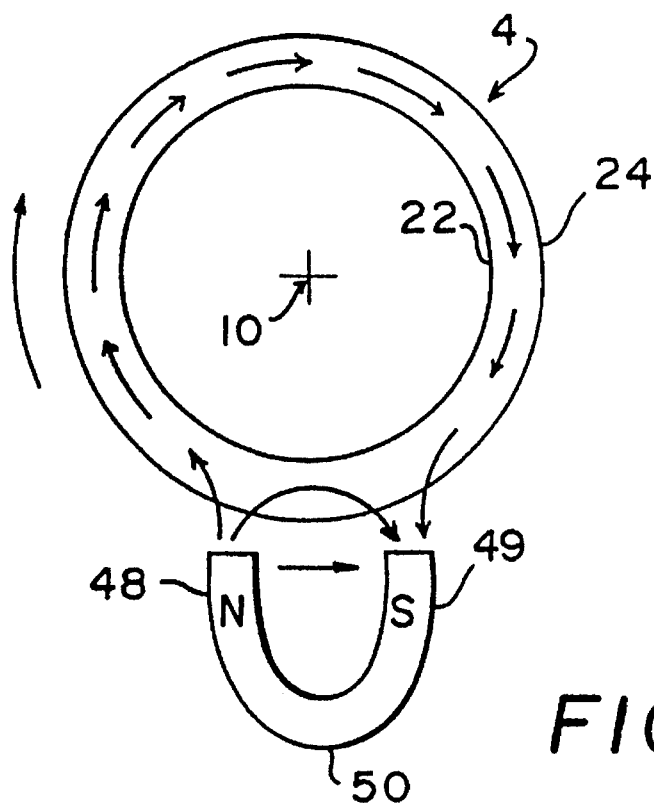
FIG. 6 is a diagram showing magnetic polarization of the transducer of the present invention by rotation through the field of a magnet.

A preferred method of polarizing transducer 4 is shown in FIG. 6. In this method, transducer 4 is polarized by rotating it in the field near two opposite magnetic poles 48 and 49, as provided for example by a horseshoe magnet 50. During the rotation of transducer 4, magnet 50 is moved radially inward close to transducer 4 (which is continuously rotating during the approach of magnet 50) and, after a few rotations to stabilize the effects of magnet 50, magnet 50 is slowly moved away far enough so that it has no further effect on transducer 4 magnetization. The polarity imparted by magnet 50 in this method will be dependent on the orientation of the poles of magnet 50 and is independent of the direction of rotation of transducer 4.

Figure 7:
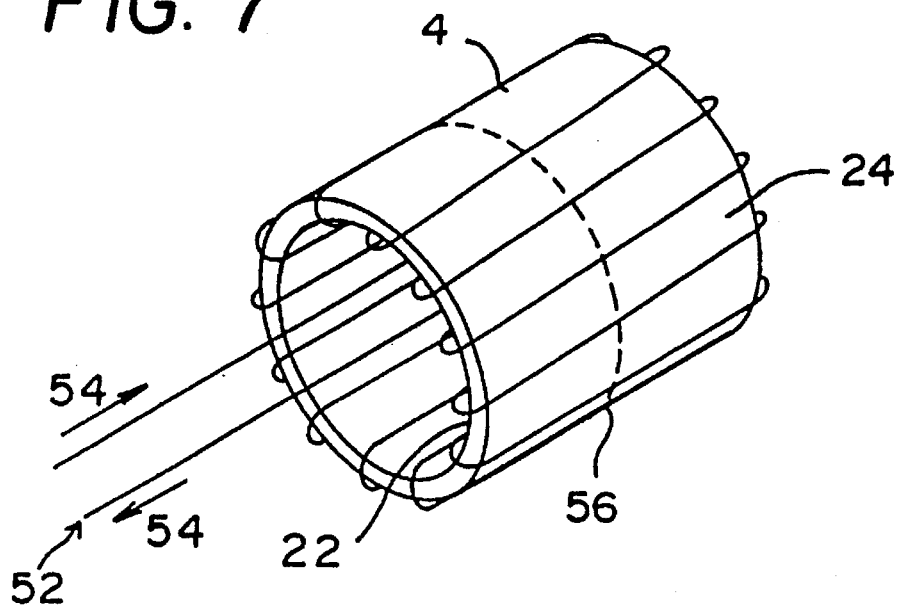
FIG. 7 is a diagram showing magnetic polarization of the transducer of the present invention by passing current through a toroidally wound conductor.

Another preferred method of generating a circularly directed field is by providing a current in an axial direction near transducer 4. For example, a suitable large unidirectional current may be conducted directly through shaft 8, on which transducer 4 is assembled. Alternatively, such a current may be conducted through a coaxial conductor passed through the central hole in transducer 4 prior to its assembly on shaft 8. Further, as shown in FIG. 7, a conductor 52 passing a current 54 in a single direction can be wrapped helically about the inside and outside of transducer 4 to form an effective row of conductors proximate to each of the inner surface 22 and outer surface 24 of transducer 4. Current flows in opposite axial directions inside and outside transducer 4 produce additive fields in the same circular directions. Winding this helical pattern and then removing it is a less desired way of polarizing transducer 4. However, for large rings, a magnetizing fixture could be made wherein conductor 52 shown in FIG. 7 is constructed in two parts. In this embodiment, the conductor parts are axially separable by translation along the central longitudinal axis of transducer 4 at a break line 56 to allow insertion of the transducer 4, after which they move toward each other to complete the helical circuit. After completion of the polarization process, the conductor parts are again translated in opposite directions along the central longitudinal axis of transducer 4 to permit removal of transducer 4.

If the single conductor method is chosen, a relatively large current is required, especially for a large diameter transducer 4, since the field at the surface of a long round conductor carrying I amperes is $H=2I/10r$ (H in Oersteds; r is the radius of the conductor in cm). For a transducer 4 of diameter 2 cm (about 0.8 inch):

$$H=2I/(10\times 1 \text{ cm})=0.2I$$

so that 1,000 amps will be required to obtain 200 Oersteds of field. A convenient way to magnetize (polarize) with a conductor 52 in this manner is by controlling current 54 with a "one shot" circuit that allows a single half wave of a 60 Hz alternating current to pass, i.e. the first complete half wave after a switch is closed. Large current pulses could also be obtained from the discharge of a capacitor bank or from the inertia of a free wheeling generator, and through other methods known to those skilled in the art.

As shown in FIG. 8, it is also possible to magnetize transducer 4 with a magnet 53 that is not as wide as the transducer 4 by feeding it axially past the transducer 4 along path 55 while continuously rotating the transducer, and this method will be particularly useful for polarizing a very large transducer 4.

SHAFT CONSTRUCTION

The construction of shaft 8 is important to the invention in that shaft 8 should not interfere with the operation of the sensor 2. It is clearly advantageous in the interest of sensitivity to direct as much as possible of the axial flux, which arises from the torque, through the magnetic field vector sensor 6. Shaft 8 and transducer 4 should be designed to work together to maximize the permeance of flux closure paths through the sensor while minimizing the permeance of all parallel paths. Thus it is important to avoid having high permeability materials either axially or radially proximate to the edges 18 and 20 of transducer 4. In general, magnetically permeable material of shaft 8 should not be permitted to create a magnetic path at transducer 4. This limitation can be achieved in several ways. Referring again to FIG. 1, in a preferred embodiment, shaft 8 is constructed of low permeability (i.e. paramagnetic) material and transducer 4 is mounted directly to shaft 8. In another embodiment, as shown in FIG. 9, shaft 8 is ferromagnetic and a low permeability spacer 60 is disposed between shaft 8 and transducer 4. In a further embodiment illustrated in FIG. 10, shaft 8 has substantially smaller diameter in region 62 proximate to transducer 4, or (as shown) shaft 8 is entirely cut away in region 62. In either case, a connecting sleeve 64 of low permeability material is provided to bridge the gap created by the cutting away of shaft 8. Transducer 4 is then mounted on connecting sleeve 64.

It should be emphasized that proper operation of devices installed using the methods of FIGS. 9 and 10 requires that there be no slippage between any of the components at their interfaces. Each assembly must act as one body over the entire rated torque range. That is, transducer 4 must be attached to the torqued member in such a way that the surface shear strain of their interface is the same on both, i.e., no slip.

Somewhat less obvious, but no less important, is the requirement that there be no inelastic strain in shaft 8 in any cross section which includes the transducer 4. Thus, all strains associated with the transmission of torque must be fully recoverable when the torque is relaxed. Since any plastic strain occurs by slippage between atomic planes or similar events, this requirement is simply an extension of the more obvious restriction on intercomponent slippage. If slippage on any scale occurs the stress in the transducer 4 will not represent the torque applied to the shaft. Moreover, there will be a distribution of residual stress over the cross section when the torque is relaxed to zero, with the transducer 4 or portions thereof in a reversed stress condition. Slippage will be manifested as a negative hysteresis in the transfer function of the transducer.

Each of these constructions also allow the transducer 4 to be pressed or shrunk on an immediately underlying component. If a dominantly circular anisotropy is to be obtained by a tensile hoop stress this feature is important. If the transducer 4 anisotropy is obtained by means other than circumferential tension, e.g., having been aged or otherwise heat treated in a magnetic field, or under circumferential tension or under axial compression, or if the performance of the device is adequate without this dominant anisotropy, other constructions are possible.

If low permeability shafts are used some attention must be directed to their strength characteristics as well as their thermal coefficients of expansion (relative to the transducer 4). Common austenitic steels (stainless steels) are usually substantially weaker than martensitic steels. Furthermore, since they are single phase materials, they cannot be heat treated to obtain greater strengths. Increasing the yield strength can only be accomplished by cold working, such as rolling, drawing, etc. Extensive cold working can cause a conversion to martensite, which is ferromagnetic.

More desirable materials for low permeability shafts are in the Nitronic family—generally having manganese with little nickel together with chromium. These steels remain fully austenitic under severe cold work and have twice the yield strength of common austenitic steels even in the annealed state. An especially suitable material is Nitronic 32 (or 33) made by Armco. Other potentially suitable materials are various Nickel alloys such as Inconel (International Nickel Co.), Beryllium-copper, and overaged maraging steel. The overaging of this steel causes a reversion to austenite. A particular advantage of overaged maraging steel is its chemical similarity to the material used in transducer 4. This similarity tends to prevent interfacial corrosion.

It may also be possible to use a through hardened, or even a case hardened, carbon or alloy plus carbon steel shaft since such mechanically hardened steels also have low permeabilities.

ATTACHMENT OF TRANSDUCER TO SHAFT

As already indicated, the transducer 4 and underlying shaft must act as a mechanical unit. Rigid attachment of the transducer 4 either directly or indirectly to shaft 8 is crucial to proper operation of transducer 4. In principle, the transducer 4 need only be attached at the two ends for this requirement to be met.

Methods of attachment may be classified according to the points of force distribution for the transmission of torque along the shaft. The points of force distribution may be either salient, distributed (areal) or diffuse.

Salient force distribution can be achieved by providing mating surfaces on transducer 4 and shaft 8 having mutually engaging profiles, such as a non-round shaft engaging a matching polygonal or elliptical hole in the transducer 4. As shown in FIG. 11, matching internal and external splines, knurls, or teeth 66 can be cut on the inner surface 22 of transducer 4 to mate with similar structures cut onto shaft 8. FIG. 12 shows another embodiment of this concept in which teeth 68 are cut into the edges 18 and 20 of transducer 4. Mating teeth 70 are also cut into the ends of two segments of shaft 8 (one shown), and a projection 72 is provided on shaft 8 to mate with the center hole in transducer 4. When transducer 4 is assembled to the two segments of shaft 8, teeth 70 mate with teeth 68 to render the shaft 8 and transducer 4 relatively rotatively immobile. In other embodiments, keys, pins, or even set screws could be used, although these fastening methods are preferred only for less structurally demanding applications.

Distributed transmission of forces can be achieved by friction or adhesive bonding of transducer 4 to shaft 8. The joint is subjected to the same shearing stress as that being transmitted. This bonding limits the maximum measurable torque to a lower value than might otherwise be handled by the shaft 8 alone or transducer 4 alone, but is advantageous for other reasons as indicated previously. Press or shrink fits can be used to obtain the desired circular anisotropy, and can provide very substantial gripping forces which as a practical matter will not be broken by expected torques on shaft 8. With clean, degassed (and perhaps deoxidized) surfaces, the effective coefficient of friction can rise without limit and act somewhat like a weld. There are also some anaerobic adhesives which make tight fits tighter by expanding into microscopic crevices when they harden. If temperature and environmental conditions do not prevent the use of adhesives, adhesives can be used with designs of transducer 4 in which the adhered area is large compared to the cross sectional area of either the transducer 4 or the joint. This can be done by creating transducer 4 from a spirally wrapped strip using interlayer adhesive as described previously.

Figure 13:
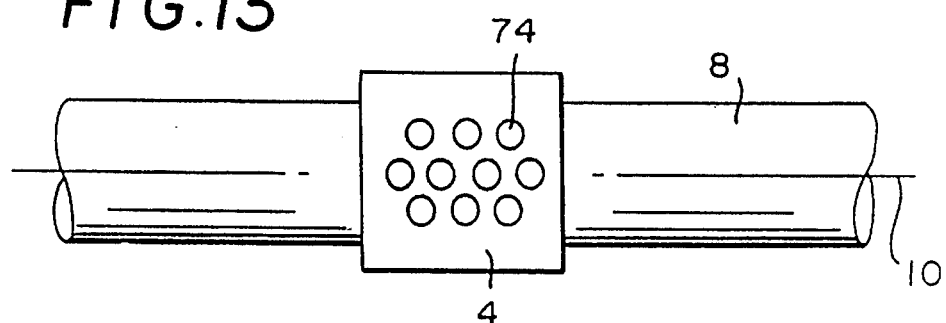
FIG. 13 is a plan view of a transducer having perforations about its circumference for receiving transducer-shaft bonding adhesive.

FIG. 13 shows an embodiment of transducer 4 which has a plurality of holes 74 through its radius which can be filled with adhesive to bond transducer 4 to shaft 8.

Figure 20A:
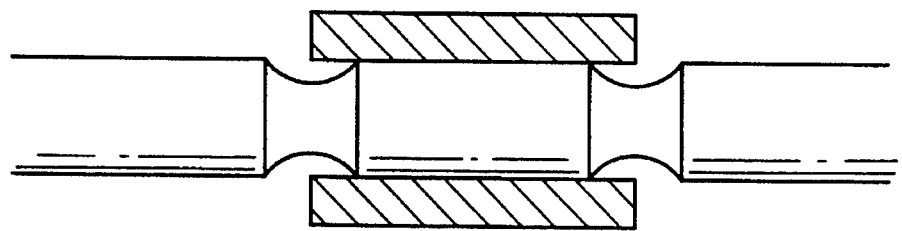
FIGS. 20a through 20e illustrate various transducer ring and shaft constructions for avoiding end effect problems.
Figure 20B:
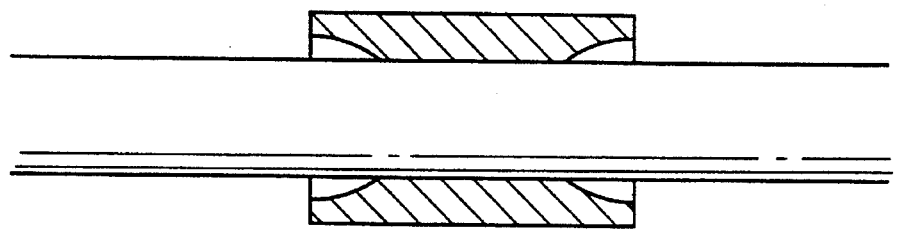
Figure 20C:
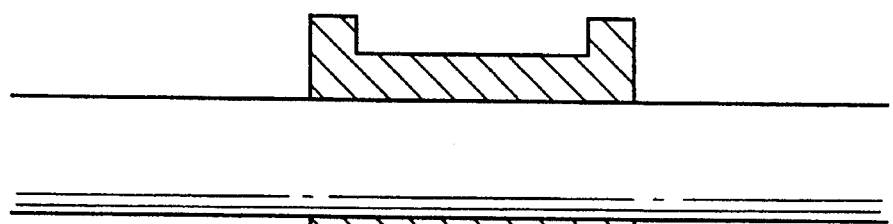
Figure 20D:
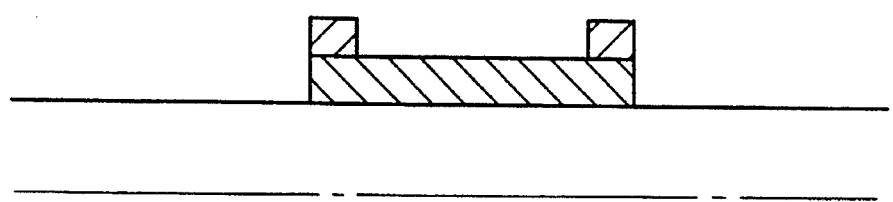
Figure 20E:
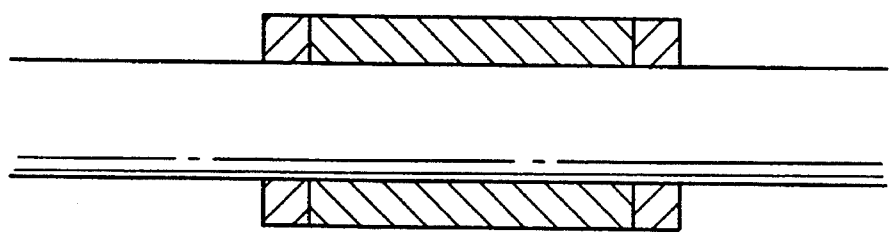

If a transducer ring is attached to a shaft by the friction associated with an interference fit, it is difficult to obtain a homogeneous interference right up to the very ends of the ring. Thus, internal chamfers or radii, tool marks, nicks, etc. prevent the uniform transfer of torque form the shaft to the ring at all portions of the periphery at the precise edge of the transducer ring. Local stresses and local stress gradients associated with these geometric imperfections are manifested by circumferential variation in the field produced by a given torque and a circumferentially variable departure from a truly zero field with zero applied torque. Rather than try for geometric perfection at the ring ends it is more practical to avoid this "end effect" problem by establishing stress free zones, of small axial extent, at each of the ring ends. By making the axial length of these sections large compared to the circumferential variation in location, relative to the plane of either transducer ring end, of the points of first firm contact between the ring and the shaft, these unstressed zones will serve to average out the local field variations. Several methods of accomplishing this are shown in FIG. 20. In FIG. 20(a), the shaft is undercut to avoid contact at the ring ends. In FIG. 20(b), the inside end portions of the ring itself are relieved to avoid contacting the shaft. In FIG. 20(c), the outside end portions of the ring are enlarged to reduce the torque associated stresses therein. In FIGS. 20(d) and 20(e), high permeability, low magnetostriction, (thus stress has no effect) material is added at the ring ends which serves to homogenize the end effects.

Figure 14:
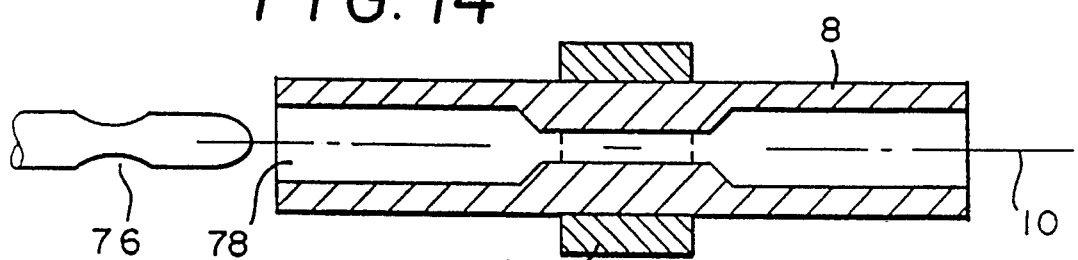
FIG. 14 illustrates internal expansion fitting of the transducer of the present invention to a shaft using a mandrel.
Figure 15:
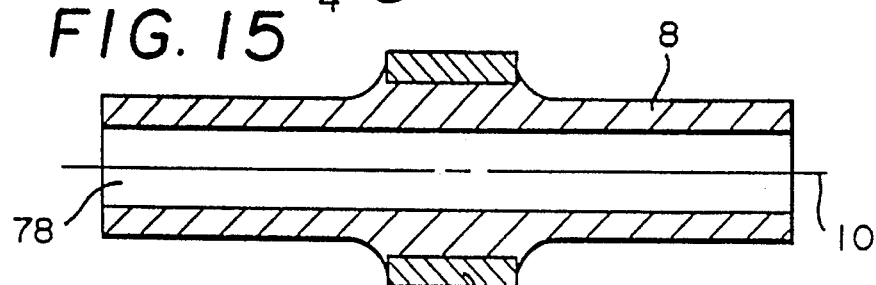
FIG. 15 shows the assembly of FIG. 14 following expansion of the shaft.

Referring now to FIG. 14, if shaft 8 is hollow, as might be the case particularly in the embodiment of FIG. 10, transducer 4 can be expanded from within by pressing an oversize mandrel 76 through the hole 78, or alternatively by hydraulic pressure or rolling. Other appropriate expansion methods that can be used are well known in the context of attaching boiler tubes to tube sheets. FIG. 15 shows the assembly of FIG. 14 after mandrel 76 has been pushed through hole 78. As will be recognized, this attachment method is desirable as it tends to expand transducer 4 radially outward, producing desired hoop stresses in transducer 4. If hoop stresses are not desired, a tight expansion fit may be provided only at the ends of transducer 4 by using the shaft 8 structure shown in FIG. 16, which is cut down in region 80 about the axial center of transducer 4.

Figure 16:
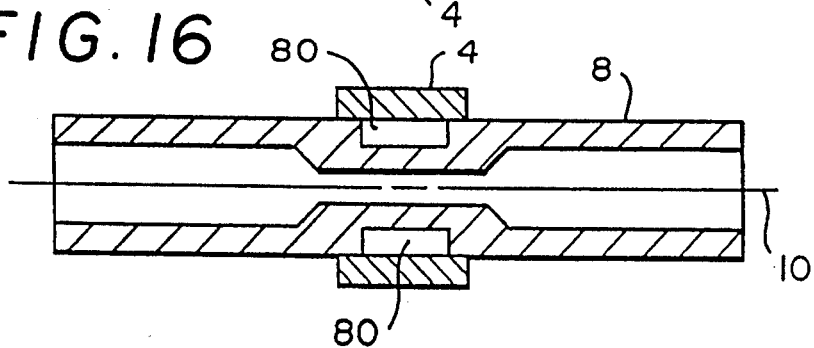
FIG. 16 shows a shaft structure suitable for use with the internal expansion process of FIG. 14 which is cut down in a center region to minimize expansion of the transducer in the central axial region.

The torque carrying capability of the joint in FIGS. 14 through 16 can be enhanced if the shaft has axial ridges (knurls) which locally cut into or deform the inside diameter of transducer 4 during expansion.

Diffuse force distribution can be achieved using welds or brazing. Welds can obviously be used at the ends or through perforations in the transducer 4 (as shown in FIG. 13). Spot welds or continuous line (seam) welds or welds over parts or all of the transducer 4 area (forge welding) can also be used. The transducer 4 could also be cast around the shaft in a mold, or sprayed (molten condition), explosively welded, electroplated or created by ion implantation or other surface modification of the shaft surface such that the transducer is directly or indirectly attached to or forms a part of the surface of the shaft. Clearly, combinations of these general methods might also be used and might be especially suitable for specific applications.

In some applications, e.g., as a torque sensor in power assisted steering applications, it is important that the ring and shaft act as a single mechanical unit even at torques 20 or more times higher than the highest torque expected to be measured by the transducer. Until there are developed means to attain coefficients of friction much greater than unity it appears necessary to use mechanical interlocking methods such as keys, splines, flutes or polygonal cross sections. In all such cases however, it is still necessary to instill a circumferential anisotropy in the transducer ring. If the ring is treated before assembly, e.g., annealing under stress or in a circumferential magnetic field, no special assembly methods are required. However, if it is desired to use hoop stress to obtain the circumferential anisotropy, which is highly desirable because of the inherent economies, some modification of the basic assembly hereinbefore described is required.

Figure 21A:
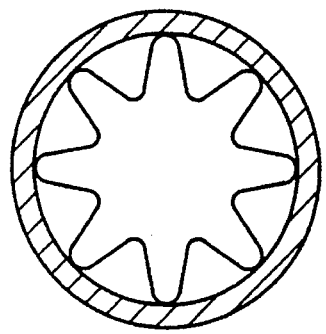
FIGS. 21a and 21b illustrate one manner of affixing the transducer ring to the shaft to enhance torque transference therebetween.
Figure 21B:
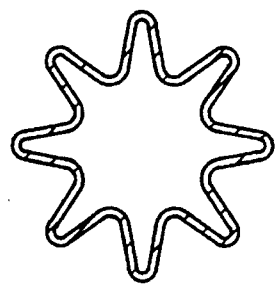

For example, in one form of assembly, illustrated in FIG. 21(a), a round transducer ring is slipped over a fluted shaft section (or one having axial knurls or splines). The ring is forced by swaging, hydraulic pressure, magneforming or similar forming methods, to conform to the contour of the shaft as shown in FIG. 21(b). Since the peripheral extent of the ring after such forming is greater than when it was cylindrical, the ring is clearly under some average circumferential tension although the actual stress differs between the peaks and valleys of its new contour. Accordingly, although this is a desirable technique for torque transference while avoiding the limitations of frictional torque transference, the resulting circumferential non-uniformity disqualifies this as a desirable technique for creating hoop stress.

It has been found that it is not necessary to form the entire axial length of the transducer ring in this manner. Rather, it is only necessary to lock the ring to the shaft at its ends in order to prevent slippage between the two at extremes of applied torque. At the same time the frictional technique described hereinbefore may be employed for obtaining simple "hoop stress" over the major portion of the ring length.

Figure 22:
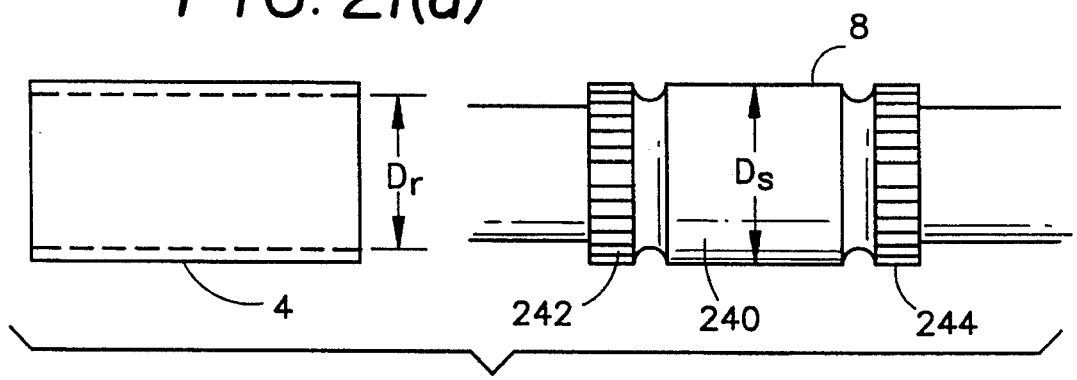
FIG. 22 illustrates an exemplary construction of the transducer ring and shaft prior to assembly to achieve both torque transference and hoop stress.
Figure 23:
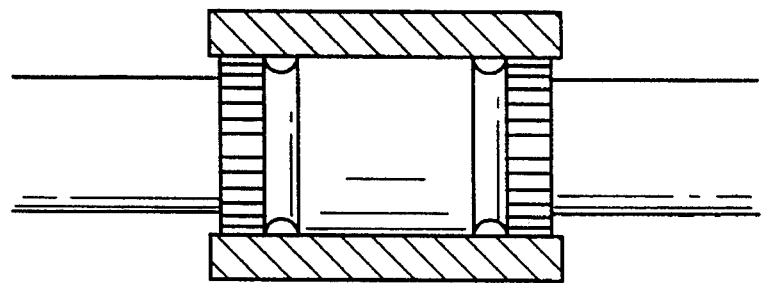
FIG. 23 illustrates the construction of FIG. 22 with the transducer ring slipped onto and positioned on the shaft.
Figure 24:
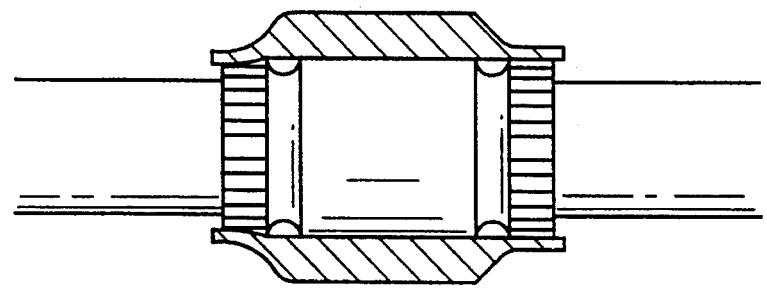
FIG. 24 illustrates the construction of FIG. 23 with the transducer ring locked to the shaft at its end portions.

With reference to FIG. 22, the transducer ring 4 has an inside diameter (Dr), which is somewhat smaller than the diameter (Ds) of the cylindrical section 240 of the shaft 8. The ring 4 is heated until Dr expands enough for the ring to be slipped onto the shaft such that it overlies at least cylindrical section 240 and fluted end sections 242, 244 of shaft 8 (FIG. 24). When cool (ring and shaft at same temperature) the portion of the ring overlying the cylindrical section of the shaft is under a uniform hoop stress and therefore exhibits a uniform circumferential anisotropy. The end portions of the ring are then forced (e.g., by any of the previously mentioned processes) to mate with the underlying fluted sections of the shaft (FIG. 23). By this means torque carried by the shaft is shared with the ring independently of the friction between the mating cylindrical surfaces.

Thus, a novel and improved method of sensing torque on a rotating shaft has been disclosed. In the first step of one preferred form of the method according to the present invention, a transducer 4 according to the present invention is constructed and attached about the circumference of a machine shaft 8 by one of the methods disclosed previously. Either before attachment or during the process of attachment, as described previously, transducer 4 will be endowed with the required anisotropic magnetic properties, and can be polarized at any time either before or after endowment with anisotropic magnetic properties. The shaft 8-transducer 4 assembly is then installed in the machine. A magnetic field vector sensor 6 according to the invention is installed proximate to transducer 4 with an orientation permitting reception of the stress-induced magnetic field of transducer 4. In operation of the machine, magnetic field vector sensor 6 then provides a signal linearly indicative of torque on shaft 8, and the signal is monitored by a feedback control or other monitoring circuit connected to magnetic field vector sensor 6.

It can be seen from the foregoing that the magnetic field created by a thin ring of circumferentially polarized magnetostrictive material is a near perfect linear analog of the torsional stress in the ring. With such a ring rigidly mounted on a shaft, it is only necessary to measure the field in the space near the ring in order to obtain a measure of the torque being carried by the shaft. The absence of any external source of magnetization together with the ready availability of low cost field sensing devices encourages the use of this simple construction for both industrial and automotive torque transducer applications. Nonetheless, in some applications, variation in the detected magnetic field arising from changing orientation of the transducer assembly in ambient fields, such as from the earth, or changing proximity to electric motors or magnetized machine parts can compromise the accuracy of the torque indication. Thus, as has been pointed out hereinbefore, practical embodiments of these transducers often require the use of either shielding structures with a concomitant increase in overall size, or active compensation methods which can significantly increase their complexity. In a second embodiment of the present invention there is disclosed a modification of the basic transducer construction which depends only on symmetry to substantially reduce the effect of external sources on the detected field.

FIG. 1 shows the arrangement of functional elements of a basic torque sensor 2. In a preferred embodiment, the ring or sleeve transducer 4 is typically pressed onto a nonmagnetic (e.g., stainless steel) shaft 8 having a somewhat larger diameter than the ID of the ring transducer 4. The resulting contact pressure at the ring/shaft interface enables the ring transducer 4 to be torsionally stressed by friction in proportion to the torque (T) carried by the shaft. This contact pressure also maintains a circumferential tensile (hoop) stress in the ring which, in a ring material with positive magnetostriction ($\lambda$), establishes a circumferentially directed uniaxial magnetic anisotropy ($K_u$). Following exposure to a saturating magnetic field in one circular direction (+) or the other (−), the circumferential anisotropy maintains a stable remanent magnetization, $+M_r$ or $-M_r$ within the ring, i.e., it is polarized. When T is applied to the shaft, the associated shear stress in the ring, characterized by orthogonal tensile and compressive stresses, reorients the dominant principal stress, thereby tilting $M_r$ through an angle $\Theta_T$. The axial component of $M_r$ associated with this tilt is clearly discontinuous at the end faces of the ring and this divergence in magnetization is the source of the field arising from the application of the torque.

In the arrangement of FIG. 3a, a field sensor 6 oriented to detect fields in the radial direction is seen to be located near one end of the transducer 4. Common practice is to locate a second (identical) sensor in a diametrically opposite position or in a symmetrical position at the other end of the ring (see FIGS. 3e, 3f). In either case, since the second sensor is in the same plane as sensor 6 and identically oriented, flux generated by the transducer ring 4 passes through it and sensor 6 in opposite directions. On the other hand, ambient fields will generally arise from distant sources and thus be of sufficiently low gradient to have the same direction and approximate intensity at both field sensor locations. Moreover, as long as radially directed fields from outside sources are small compared to the anisotropy field, they will not alter either the direction or orientation of the ring magnetization. Thus, as has already been described hereinbefore, with this arrangement, the difference in the output signals from the two sensors is, to the largest extent, due only to the field generated by the ring itself via the reorientation of $M_r$.

In contrast to its insensitivity to radial fields, the orientation of the magnetization in the ring can be readily affected by an axial magnetic field ($H_a$). The fields arising in reaction to an applied axial field will have the same polarity (i.e., that of $H_a$) with rings having either $+M_r$ or $-M_r$ polarizations. In general then, the detected field can be written as $$H = aT + bH_a$$

where a and b are constants associated with any one transducer design. Thus, unless steps are taken to ensure the adequate reduction of the $H_a$ term (e.g., shielding) the embodiment hereinbefore described can give ambiguous torque indications.

Figure 25:
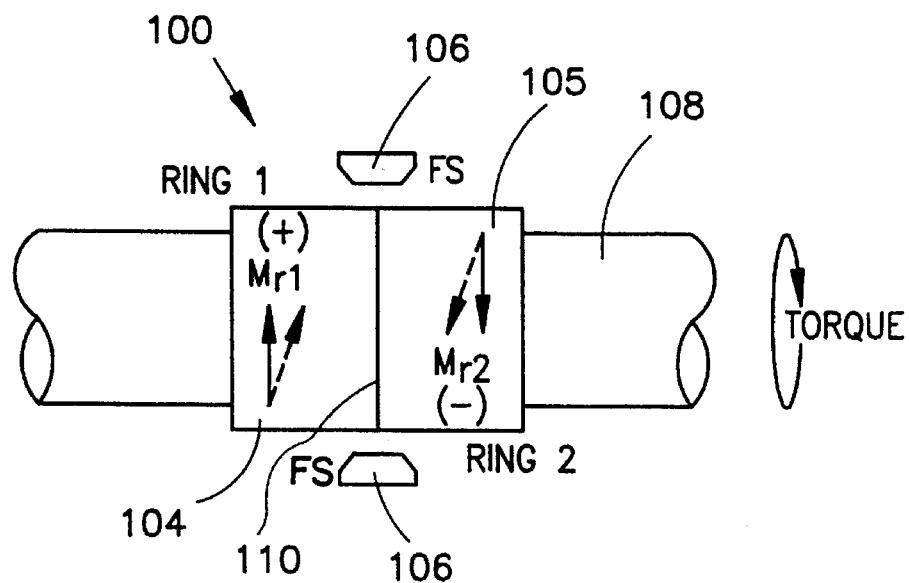
FIG. 25 is an assembly drawing showing the sensor of the present invention utilizing two oppositely polarized transducer rings.

While the effects of torque and axial field on detected field are themselves indistinguishable, it has been found that the different dependencies of their respective effects on the direction of the circular magnetization provides a means to separate them. FIG. 25 shows a torque sensor construction 100 utilizing two oppositely polarized rings 104, 105 to effectively eliminate any dependence of the detected field on axial fields. In the construction shown, transducer rings 104, 105 are mounted on shaft 108 with magnetic field vector sensors 106 mounted closely adjacent the upper and lower ring surfaces at the contiguous faces 110 of the rings. Although rings 104, 105 are shown to be abutting, they need not be physically contiguous. It is sufficient if rings 104, 105 are close enough that the radial components of their individually generated fields can be detected by the same field sensor. When arranged in this manner the rings can be said to be magnetically contiguous. Operation of torque sensor 100 can be readily understood by considering the separate contribution of each of the rings 104, 105 to the detected field when the shaft 108 is either subjected to torque or situated in an axial field.

As is well known, the effect of the applied torque is to rotate the magnetization towards the right in a ring having $+M_r$ polarization and to the left in a ring having $-M_r$ polarization (see dashed line magnetization vectors in FIG. 25). Thus, the right end of a $+M_r$ ring will develop the same polarity as the left end of a $-M_r$ ring. If the tight end of a $+M_r$ ring and the left end of a $-M_r$ ring are placed close enough to each other so that the radial components of their individually generated fields can be detected by the same field sensor, the detected field, now having two contributors, will be larger than that from either ring alone.

In an axial magnetic field the magnetizations in rings having either direction of circular magnetization will rotate towards the field direction. Hence, the right end of a ring will develop an opposite polarity to the left end regardless of its (+) or (−) polarization. Thus if the right end of one ring is placed close to the left end of the other, the radial components of their individually generated fields arising from these axial fields will be in opposite directions at the location of the field sensor. For two identical rings (1 and 2) subjected to the same torque and the same axial field, the total detected field is $$H = a_1 T + a_2 T + b_1 H_a - b_2 H_a = 2a_1 T$$

since for identical rings $a_1=a_2$ and $b_1=b_2$. The detected field is now totally dependent on the applied torque and is free of the ambiguity associated with $H_a$.

As previously described, the use of two field sensors also provides independence of the transducer output signal from radial fields. Since arbitrary fields from outside sources may have both radial and axial components, this new dual ring construction provides an output signal that is substantially independent of all such fields.

It will be appreciated that this independence from ambient fields greatly attenuates the "magnetic noise" in the output signal of the field sensor, thereby reducing or eliminating the need for bulky and expensive shielding. The attendant increase in signal/noise ratio with this dual ring construction has great significance in the automotive power steering application wherein the signal fields are relatively feeble. If the magnetic noise is low enough, the electrical output signals of the field sensors can be electronically amplified to provide any effective sensitivity desired. This very same effect can be obtained with the rings polarized in the same circular direction if the respective magnetostrictions of the rings have opposite signs. However, considering the very limited number of materials having a suitable combination of magnetic and mechanical properties, this possibility is commercially unlikely.

To allow side by side comparisons, two experimental torque sensors were constructed from 18% Ni maraging steel, one with two, oppositely polarized 10 mm wide transducer rings and the other with a single 20 mm wide transducer ring. The rings were internally tapered to facilitate attainment of the desired hoop stress. Prior to being pressed onto their respective shafts, the transducer rings were circularly magnetized by the field of a coaxially conducted 600 A peak, half sinusoid current 8.3 ms duration.

Figure 26:
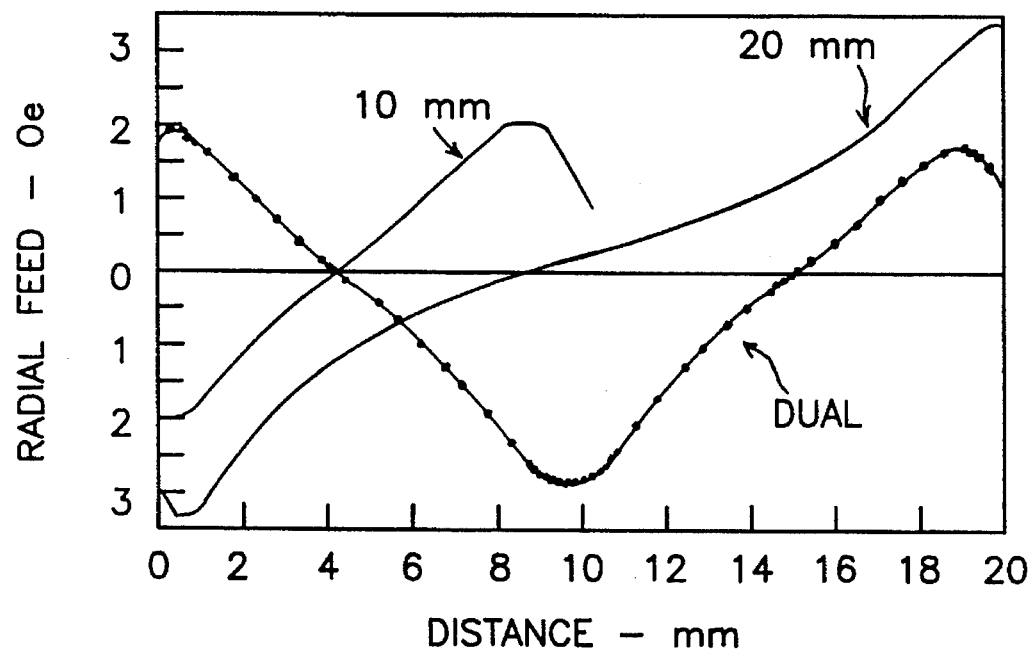
FIG. 26 graphically illustrates the detected radial field intensity as a function of axial position along the ring for a single width ring, a double width ring and dual single width rings.

The radial component of the magnetic fields arising from the application of a 10 N-m torque to each of the torque sensors was measured with a calibrated (2.22 mV/Oe) Hall effect probe. Measurements of this field as a function of axial position along a single 10 mm ring (prior to installation of the second ring), along the pair of rings and along the 20 mm wide ring are graphically illustrated in FIG. 26.

The field intensity for each of the single rings is seen to vary as expected, from a maximum near one end, through zero at the axially central position to an opposite polarity maximum near the other end. As also expected, the dual ring transducer shows the strongest field opposite the contiguous faces of the two rings, with smaller, reversed polarity peaks at the two outboard ends. The decrease in peak field at the outboard end of the first 10 mm ring, following installation of the second, reflects the demagnetizing effect of the field generated by the second ring. The high peak intensity at the center of the two ring assembly is less than the sum of the two ends since the axial field from each ring is not uniform throughout the other, it being most intense at their common boundary. In other tests conducted but not shown in FIG. 26, this peak intensity has reached 110–120% of the peak found for the single 20 mm ring indicating that the demagnetization effects of each ring on the other do not reduce the torque sensitivity of the transducer.

Figure 27:
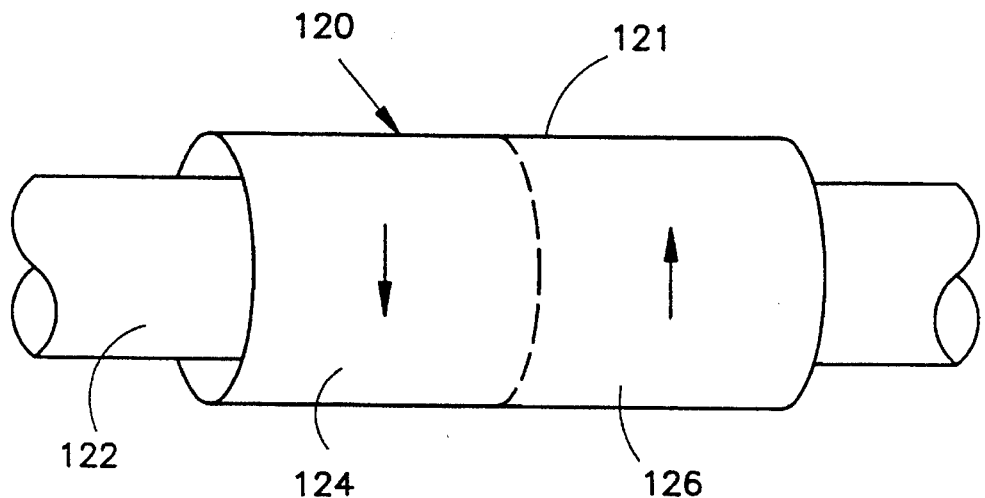
FIG. 27 is an assembly drawing showing the sensor of the present invention utilizing a single transducer ring having two axially distinct, oppositely polarized circumferential regions.

Not only can two oppositely polarized, magnetically contiguous rings reduce the effects of ambient magnetic fields on indicated torque, but also this result can be achieved with any number of physically separate but functionally cooperating circumferential rings. In addition, it has been found that in lieu of two separate rings, a single ring divided into two or more oppositely magnetized, axially distinct circumferential regions, with each pair of magnetically contiguous, oppositely polarized regions separated by a domain wall and distinguished by the magnetic field each creates in proximate space when torsionally stressed. The regions may be abutting or may be axially spaced apart with non-polarized circumferential regions therebetween. They may or may not be physically distinct regions and there may or may not be non-destructive ways for determining their respective axial locations or their states of magnetization other than by the application of torsional stress. For example, with reference to FIG. 27, a torque sensor 120 comprises a single transducer ring or sleeve 121 press or interference fit onto shaft 122 and having axially distinct, oppositely polarized circumferential regions 124, 126.

Whether the transducer ring is attached to the shaft by an interference fit or by other methods described hereinbefore, such as swaging the ends of a ring over serrations on the shaft, in order to ensure a rigid connection independent of the coefficient of friction or by other mechanical means of attachment (pins, keys, etc.) or even by welding, the problem is that the torsional stress in the ring is inhomogeneous in the area of attachment. Therefore, if the full axial extent of the ring is polarized, as in FIG. 27, the "pole" strength is not uniform around its circumference.

Figure 28:
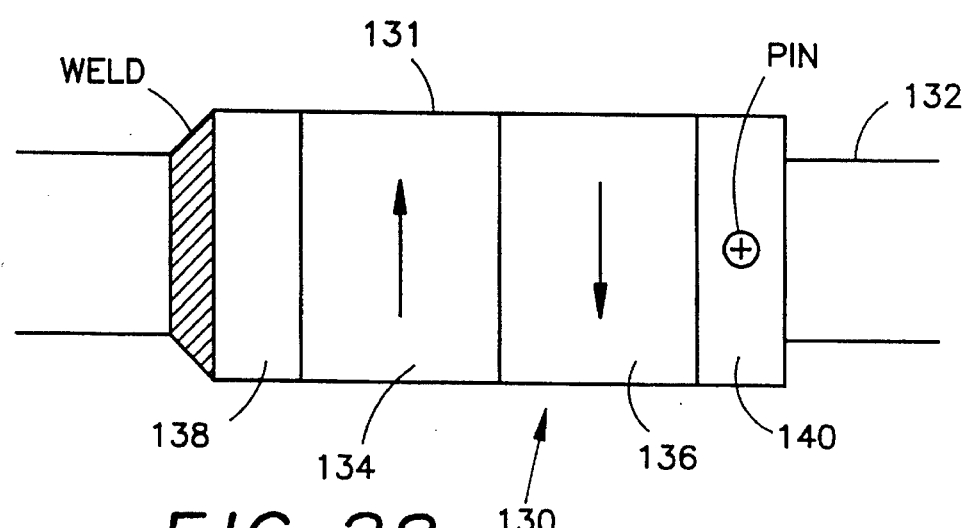
FIG. 28 is an assembly drawing showing the sensor of the present invention utilizing a single transducer ring having non-polarized circumferential end regions and two axially distinct, oppositely polarized circumferential regions therebetween.

This troublesome effect can be reduced by limiting the polarized regions to portions of the ring that are far enough distant from the attachments to not feel their associated stress concentrations. For example, with reference to FIG. 28, torque sensor 130 comprises a single transducer ring 131 attached onto shaft 132 and having localized, axially distinct oppositely polarized circumferential regions 134, 136 and non-polarized circumferential end regions 138, 140. For illustrative purposes, ring 131 is shown attached to shaft 132 via a weld along its left circumferential end and via a pin adjacent right circumferential end.

Figure 29:
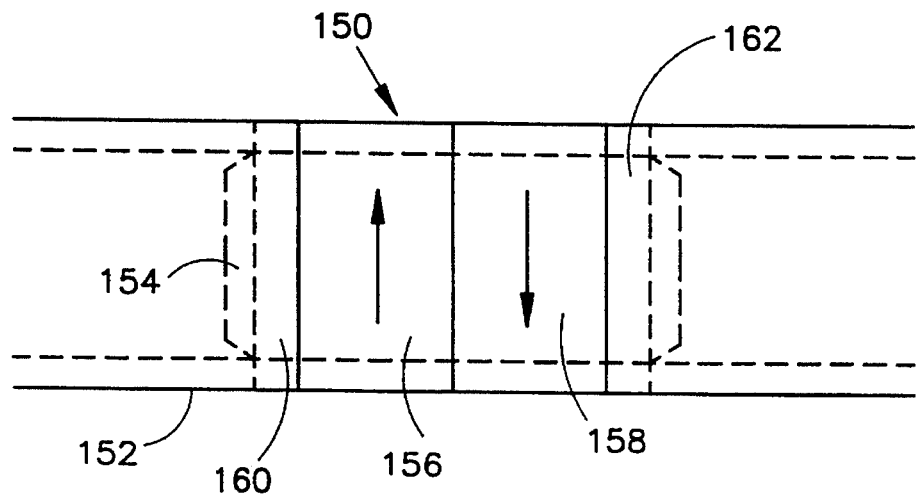
FIG. 29 illustrates a sensor of the present invention wherein non-polarized circumferential end regions and axially distinct, oppositely polarized circumferential regions are formed as part of the surface of the shaft.

The oppositely polarized circumferential regions need not be placed on the shaft, for example, by attachment of a transducer ring on the surface of the shaft. Rather, the oppositely polarized regions can form a part of the surface of the shaft. For example, with reference to FIG. 29, torque sensor 150 comprises a tubular shaft 152 into which a plug 154 is press fit to localize the region of the shaft surface under hoop stress to the axial extent of the plug. Axially distinct, oppositely polarized circumferential regions 156, 158 further localize the polarization and define non-polarized circumferential end regions 160, 162. By locating the polarized regions 156, 158 far enough away from the ends of plug 154, a constancy of hoop stress and torsional stress is assured. Notwithstanding that the entire shaft may be (but need not be) magnetoelastic, the "poles" that appear when torque is applied do so only at the ends of polarized regions 156, 158 within the portion of the shaft under hoop stress. This concept of local polarization is not limited to the establishment of two polarized regions but may be used to construct torque sensors having more or less than two (e.g., 1, 3, 4) polarized regions. Likewise, the notion is equally applicable to rings formed of separate pieces, to single rings on which multiple regions are formed and to any of the methods hereinbefore described for establishing a magnetoelastically active region on or forming a part of the surface of the shaft.

In this connection the term "on" the surface of the shaft includes any surface of the shaft and, specifically, the inner diametric surface of a tubular shaft. For example, a transducer ring having a negative magnetostriction, e.g., nickel, high nickel alloys, many ferrites, and the like, may be pressed into the opening of a tubular shaft to form an interference fit with the inner diametric surface, whereby the compressive "hoop" stress resulting from such an inverted configuration achieves the desired circular anisotropy in the ring. The magnetic field sensor would be mounted in such a way as to protrude into the hollow ring to wherever the poles form. Such a construction would facilitate the measurement of torque transmitted to or from a pulley (or sprocket or gear) mounted near the end of a shaft and would be useful at the end of motor shafts, for example.

Where there are two magnetically contiguous, oppositely polarized, axially distinct circumferential regions, as can be seen from FIG. 25, the preferred location for the field sensor is at the domain wall between or the contiguous faces of the two oppositely polarized regions. However, in many cases it is difficult to precisely position the field sensor or to identify the precise location of the domain wall. In some applications the shaft moves axially due to bearing clearances, thermal expansion, and the like, thus upsetting even the most carefully aligned field sensor. By use of more than two polarized regions, it has been found that the required accuracy of alignment of the shaft/ring assembly and the sensor assembly can be reduced.

Figure 30A:
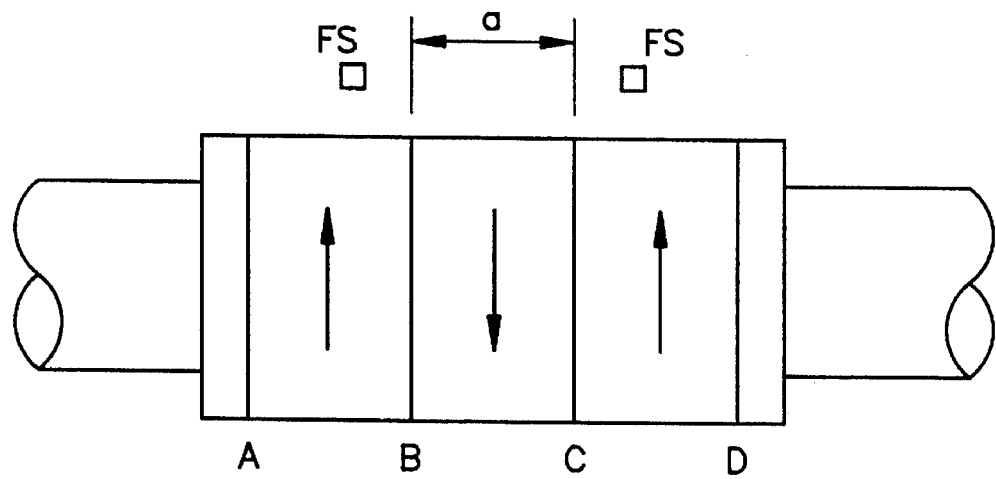
FIG. 30(a) illustrates a sensor of the present invention having three polarized regions and FIG. 30(b) graphically illustrates the detected field intensity of such a sensor as a function of axial position.
Figure 30B:
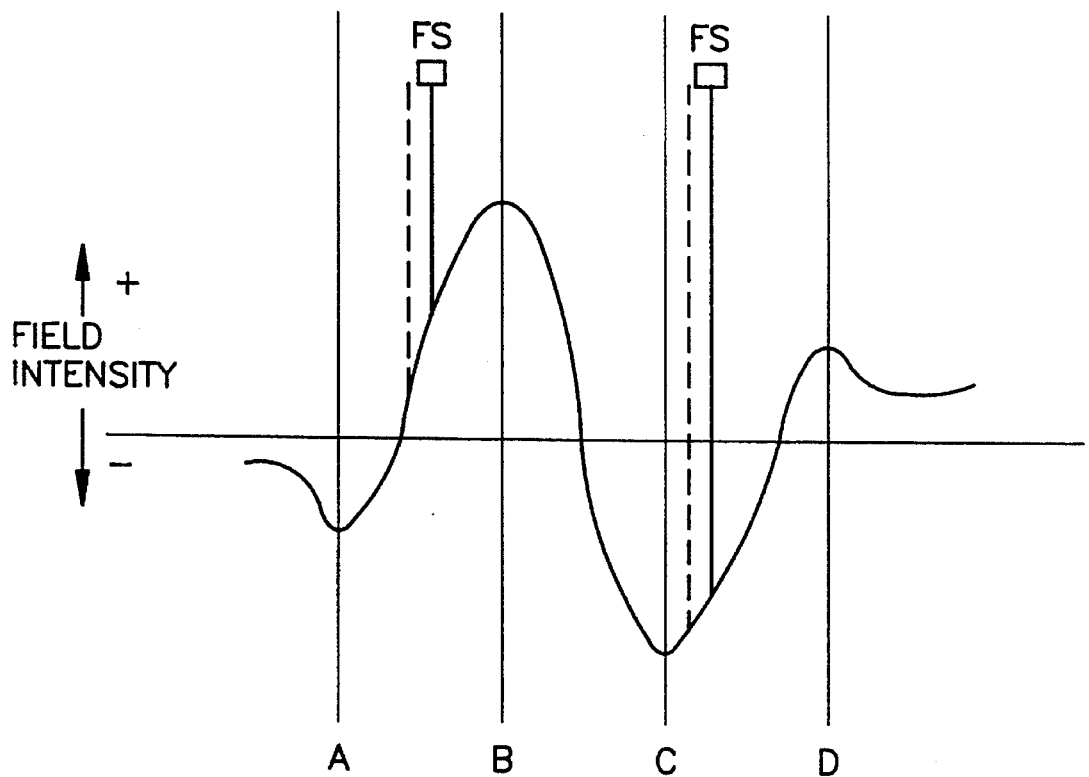
Figure 31A:
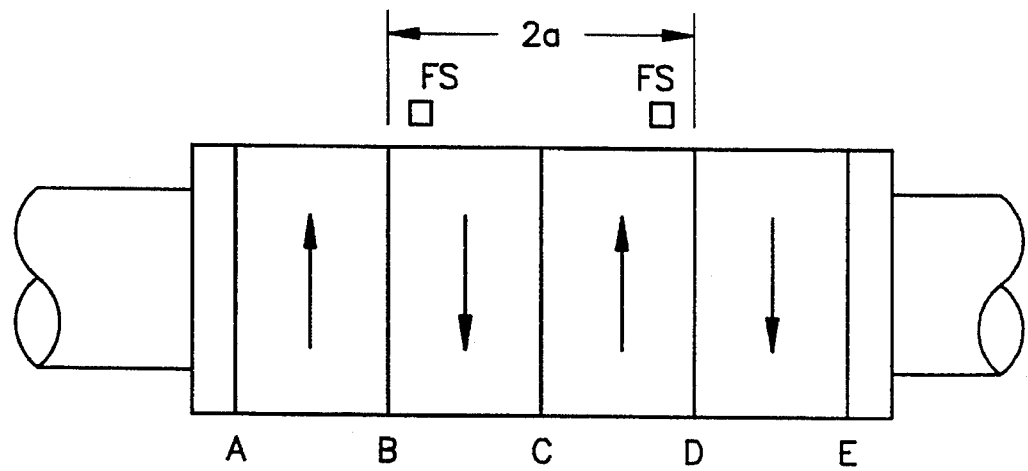
FIG. 31(a) illustrates a sensor of the present invention having four polarized regions and FIG. 31(b) graphically illustrates the detected field intensity of such a sensor as a function of axial position.
Figure 31B:
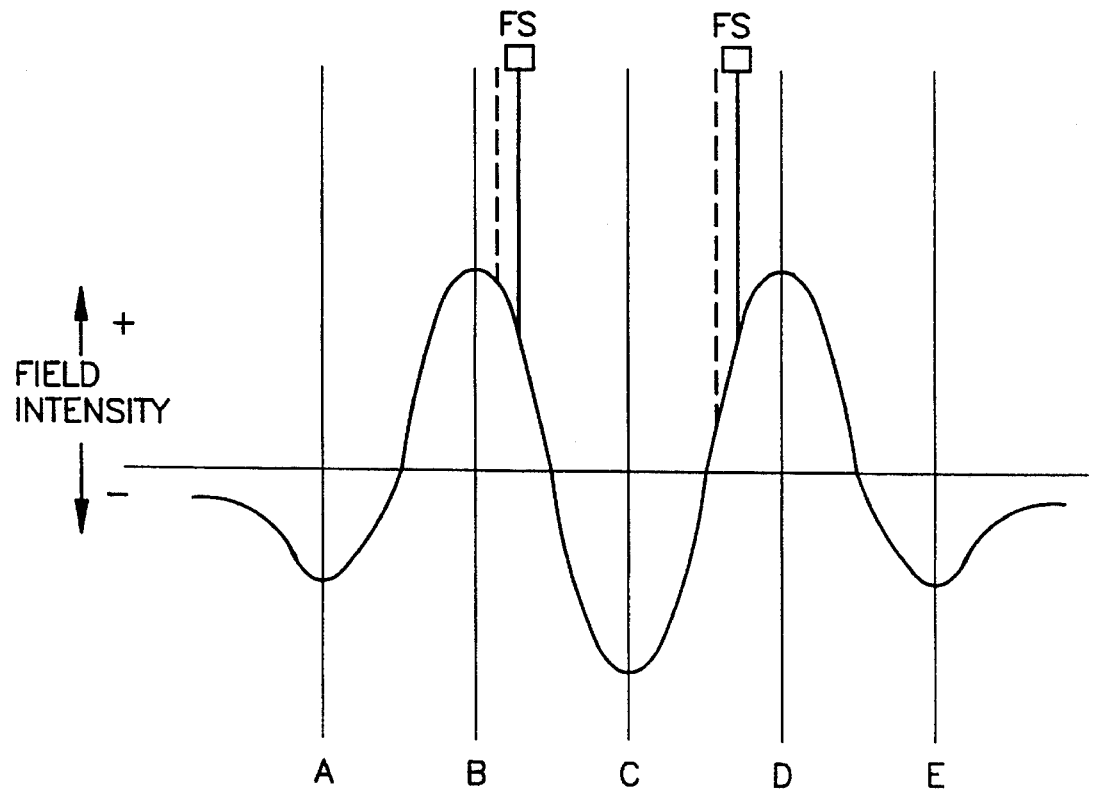

Referring to FIGS. 30 and 31, there is illustrated, respectively, in 30(a) and 31(a) a shaft mounted transducer ring having three polarized regions (FIG. 30(a)) and four polarized regions (FIG. 31(a)). The domain walls or contiguous faces of oppositely polarized or non-polarized regions are indicated as A, B, C, D and E and the interwall or interface distance (hereinafter referred to as "interwall" distance since a de facto domain wall exists at the contiguous faces of two contiguous rings) is shown in each to be "a" or some multiple thereof. The field sensors FS are deliberately positioned such that the distance between them does not equal the distance "a" between the domain walls or a multiple (e.g., 2a, 3a) thereof. As can be seen from FIGS. 30(b) and 31(b) which graphically illustrate field intensity as a function of axial position along the transducer ring, the field is most intense at the domain walls. While it would be desirable to position the field sensors at the domain walls, in order to sense the fields of maximum intensity, it is not always practical to do so. By separating the field sensors by a distance larger or smaller, i.e., other than, a, 2a, 3a, etc., then both sensors cannot simultaneously sense a field of maximum intensity. While the preferred location of each field sensor is proximate to but not directly on the domain walls, it can be seen from FIGS. 30(b) and 31(b) that small axial displacements of the shaft, e.g., to the right in the figures, which causes the field sensors to sense fields which are displaced in FIGS. 30(b) and 31(b) to the left (shown in dashed lines) of the originally sensed fields would increase the field at one sensor while, at the same time, decrease the field at the other sensor. If the output signal of the torque sensor is the sum of the absolute values of the signals from each of the two field sensors, this sum will tend to remain constant even though the individual sensor signals will be altered by such axial movement. Therefore, the accuracy of alignment between the shaft/ring assembly and the sensor assembly is not as important since small axial shafts of the shaft/ring assembly do not appreciably alter the output signal.

Where individual, oppositely polarized, abutting rings are used, there is little difficulty in identifying the location of their contiguous faces. However, it is usually difficult to precisely locate the position of the domain walls in a single ring having multiple oppositely polarized, axially distinct circumferential regions since neither their presence nor location can be sensed until the shaft is torqued. Rather than attempt to determine where the domain walls might be at any given time, it is far simpler to pin their locations to predetermine their precise location and prevent unwanted migration. This is best accomplished by notching, etching, scribing or otherwise physically marking the ring with a narrow circumferential band at the selected locations demarking where the domain wall will be located. This may be accomplished using a sharp tool, laser, roller or the like. Alternatively, a narrow high permeability ring (a homogenizer) may be circumferentially placed about the shaft over the location where the domain wall is to be located. The resulting physical boundary, stress gradient, composition gradient, texture gradient, or other like change caused by the domain wall demarkation establishes an energy well which effectively pins the domain wall at an established and precise location.

Turning now to methods of polarizing the various domains, it will be appreciated that if separate rings are used for each domain, then each ring may be polarized before it is assembled on the shaft. This "prepolarizing" can be done using any of the methods hereinbefore taught. If two or more locally polarized regions are to be instilled into a single ring (either separate from the shaft physical entity or a functionally equivalent, bandlike portion of the shaft itself) then not all of these methods are viable. The choice of polarizing method will depend on many factors, e.g., whether the ring is already assembled to the shaft, the physical sizes of the ring and the shaft and whether a single torque transducer is to be made or many transducers are to be mass produced. Whatever the specific choice of method, there are two general modes of polarizing any one circumferential region, i.e., all at once or sequentially.

Figure 32:
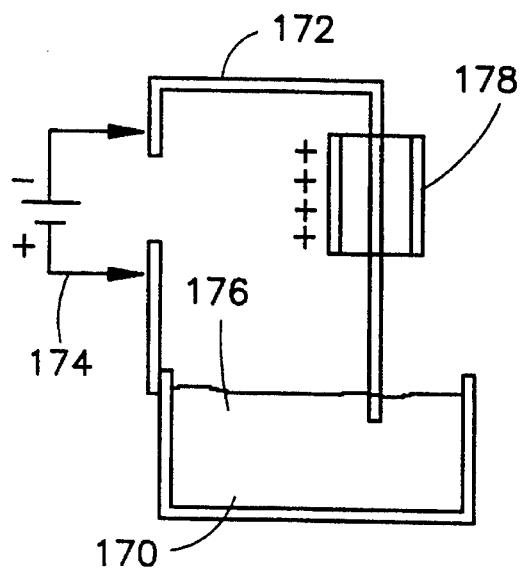
FIG. 32 illustrates the apparatus for and a first step in a method of creating multiple, oppositely polarized, contiguous circumferential regions in a ring.
Figure 33:
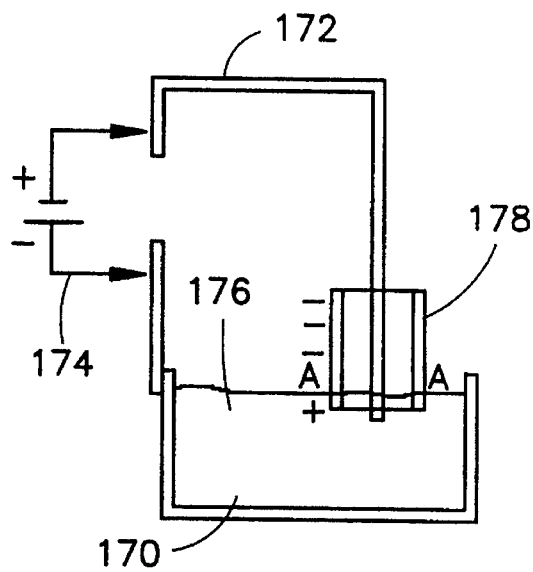
FIG. 33 illustrates a further step in the method of FIG. 32.
Figure 34:
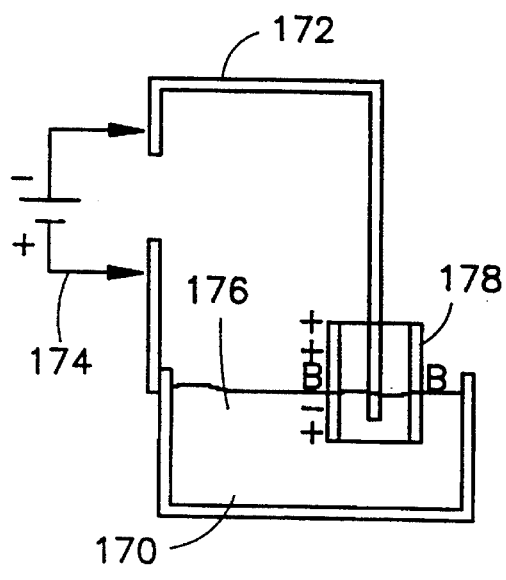
FIG. 34 illustrates a still further step in the method of FIG. 32.
Figure 35:
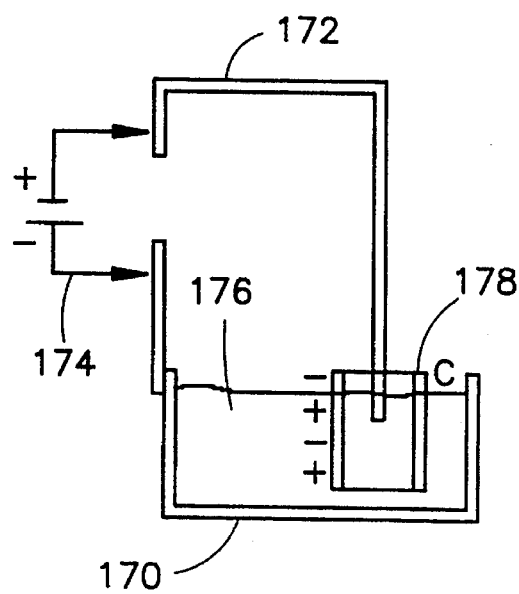
FIG. 35 illustrates the final step in the method of FIG. 32.
Figure 36:
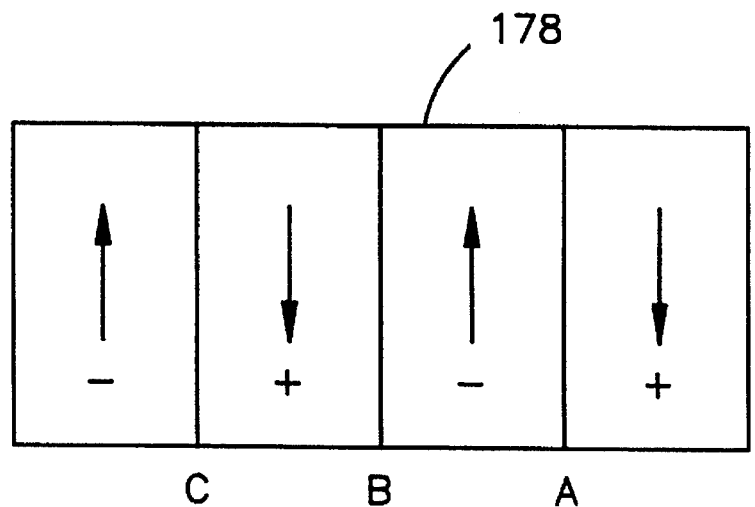
FIG. 36 illustrates the ring produced by the method of FIGS. 32–35.

Polarizing the entire circumference all at once is accomplished by the passage of an electrical current either through the shaft itself or through a coaxial conductor threaded through the ring. An example of how multiple, oppositely polarized, contiguous circumferential regions may be created in a ring by this method is illustrated in FIGS. 32, 33, 34 and 35 and explained hereinafter. With reference to FIG. 32, a conductive container 170 is electrically connected via conductor 172 and d.c. power source 174 to a conductive liquid 178 within the conductive container 170. The conductor 172 passes coaxially through ring 178 which, initially, is supported out of contact with conductive liquid 176. With the polarity of d.c. source 174 arranged as indicated, upon current flow through conductor 172 the entire axial length of the ring is polarized in a first direction (indicated as +). In a second step, shown in FIG. 33, ring 178 is immersed in conductive liquid 176 up to circumferential position A, the polarity of d.c. source 174 is reversed, and a current pulse is made to flow through the conductor 172, conductive liquid 176 and those portions of the ring 178 not immersed in the conductive liquid. In this manner, the polarity in those portions of the ring 178 in which the current is flowing, i.e., those portions of the ring 178 not immersed in the conductive liquid 176, is reversed (indicated as −). In a third step, shown in FIG. 34, the ring 178 is further immersed in conductive liquid 176 up to circumferential position B. The polarity of d.c. source 174 is again reversed and again current is made to flow in those portions of the ring not immersed in the conductive liquid to again reverse the polarity in the non-immersed portions (indicated as +). In a final step, shown in FIG. 35, the ring 178 is still further immersed in conductive liquid up to circumferential portion C. The polarity of d.c. source 174 is again reversed and again current is made to flow through the non-immersed portions of the ring to reverse the polarity in those portions (indicated as −). The resulting polarized ring 178, shown in FIG. 36, comprises four contiguous, axially distinct, oppositely polarized circumferential regions separated by domain walls A, B, C.

In like manner, any desired number of circumferential, oppositely polarized regions may be created in ring 178. If it is desired to interpose a non-polarized band between any of the regions, or at the ends of the ring, these can be created by positioning the ring as in any of FIGS. 32–35 and passing a damped alternating current through conductor 172 in order to "non-polarize" the non-immersed portions of the ring.

Figure 37:
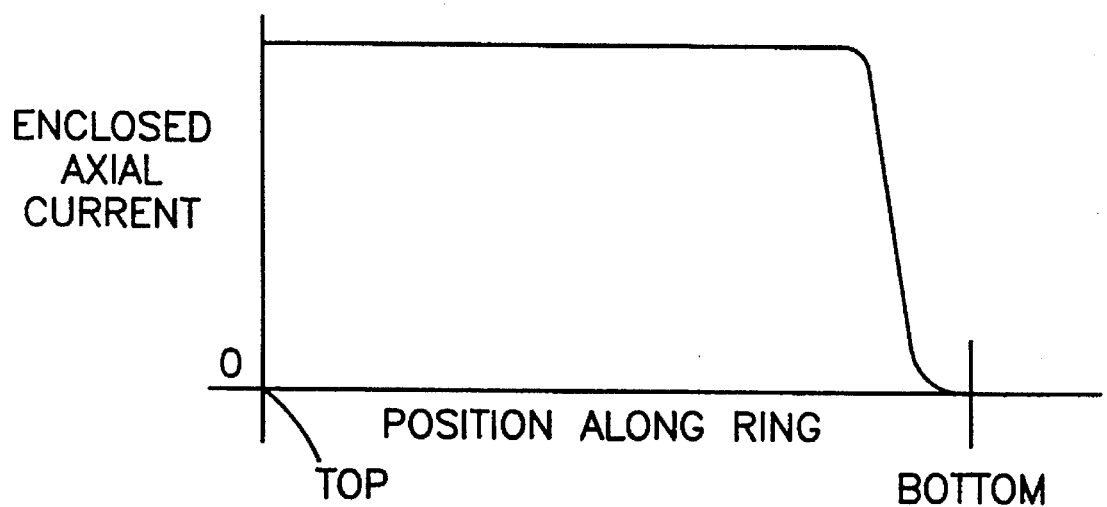
FIG. 37 illustrates the graphical relationship between enclosed current and position along the ring for the method and apparatus of FIG. 33.

The conductive liquid may be mercury, molten Wood's metal, or the like or need not be an actual liquid. Rather, it may be, for example, a fluidized bed of a finely divided conductive solid, e.g., copper, aluminum or graphite. If the shaft isn't inconveniently long the above described method can also be used to create multiple domains in a ring that is already assembled onto a shaft. Instead of a liquid, the shaft may be "immersed' in a conductive tube fitted with spring fingers encircling the ring and making good electrical contact over substantially the entire ring circumference. The idea, of course, is to prevent the conducted current from flowing (coaxially) within the ring in those portions wherein no further polarization is desired. Once the current enters the region where the ring is no longer the outermost conductor it spreads radially, diffusing over the entire conductive area. The magnetizing field acting at any radius within the ring is directly proportional to the axial current enclosed. (H=0.2 I/r where H is the field in Oersteds, I the enclosed current in amperes and r the radius in centimeters.) Consider the graphical illustration shown in FIG. 37 of enclosed current vs position along the ring for the circumstance shown in FIG. 33. A short distance below "A" the magnetizing field due to the enclosed current becomes less than the coercive force of the ring material and is thus unable to reverse the magnetization in these (immersed) portions of the ring.

Polarizing the entire circumference sequentially requires rotation of the ring while each region (or portion thereof) being polarized is subjected to a local field having the required polarity. One, some, or all of the regions can be polarized simultaneously in this manner. Either electric currents or permanent magnets can be used as the source(s) of the local field(s), as is shown in FIGS. 38, 39 and 40.

With reference to FIG. 38, ring 180 is mounted on shaft 182 in any manner described hereinbefore. Conductor 184 is arranged in optional yoke 186 adjacent ring 180 in such a manner that current flows in opposite directions in the portions of conductor 184 adjacent ring regions AB and CD than adjacent ring region BC. In this manner, as ring 180 and shaft 182 are caused to rotate in one direction, opposite polarizing fields arise in ring regions AB and CD as compared to ring region BC. After several rotations the contiguous regions are oppositely polarized. The same result is achieved in the arrangement illustrated in FIG. 39 wherein permanent magnets 190, 192, 194 are arranged adjacent ring regions AB, BC and CD, respectively. The polarities of magnets 190 and 194 are arranged identically and oppositely to the polarity of magnet 192 such that, as ring 180 and shaft 182 are caused to rotate in one direction and the magnets are simultaneously withdrawn (or keepers are inserted across the poles) ring regions AB and CD become oppositely polarized compared to ring region BC. A similar result is achieved in FIG. 40 wherein ring 200 is mounted on shaft 202 and magnets 204 and 206 are arranged on diametrically opposite sides of ring 200 adjacent ring regions AB and BC, respectively. For descriptive simplicity only two regions are shown for ring 200 although, it will be appreciated, any number of regions can be formed along the ring. The polarities of magnets 204 and 206 are similarly arranged. However, due to their respective positioning on opposite sides of ring 200, as ring 200 and shaft 202 are caused to rotate in one direction and the magnets are simultaneously withdrawn (or keepers are inserted across the poles), ring regions AB and BC become oppositely polarized.

I claim:

1. A magnetoelastic torque sensor for providing an output signal indicative of the torque applied to a member about an axially extending axis, of said member, comprising:

a magnetoelastically active element directly or indirectly attached to/or forming a part of the surface of said member in such a manner that torque applied to said member is proportionally transmitted to said element;

said magnetoelastically active element being endowed with an effective uniaxial magnetic anisotropy having the circumferential direction as the easy axis and comprising two or more axially distinct, magnetically contiguous circumferential regions which are oppositely magnetically polarized in a circumferential direction, whereby, when torque is applied to said member, said magnetoelastically active element produces a magnetic field varying with said torque; and magnetic field sensor means mounted proximate to said magnetoelastically active element and oriented with respect thereto to sense the magnitude of said magnetic field and provide said output signal in response thereto.

2. The torque sensor of claim 1 wherein said magnetoelastically active element has, in the absence of torque applied to said member, a circumferential magnetic orientation having no net magnetization component in the axial direction.

3. The torque sensor of claim 2 wherein said magnetoelastically active element has, when torque is applied to said member, a helical magnetic orientation having both circumferential and axial components, said magnetic field sensor means being positioned and oriented for sensing the magnetic field arising from said axial components of magnetization.

4. The torque sensor of claim 1 wherein said magnetic field sensor means comprises a solid state sensor.

5. The torque sensor of claim 4 wherein the magnetic field sensor means comprises a Hall-effect sensor.

6. The torque sensor of claim 4 wherein the magnetic field sensor means comprises a magnetoresistance device.

7. The torque sensor of claim 1 wherein the magnetic field sensor means comprises a magnetometer.

8. The torque sensor of claim 1 wherein said magnetoelastically active element comprises ferromagnetic, magnetostrictive transducer means.

9. The torque sensor of claim 8 wherein said transducer means comprises a ferromagnetic, magnetostrictive transducing layer at the surface of said member.

10. The torque sensor of claim 8 wherein said transducer means comprises a region of the surface of said member.

11. The torque sensor of claim 8 wherein said transducer means comprises at least one ring.

12. The torque sensor of claim 11 wherein the surface shear strain at the interface of said member and said transducer means is the same on said member and said transducer means.

13. The torque sensor of claim 11 wherein said ring is tubular having opposite end faces and an axially extending circumferential portion therebetween.

14. The torque sensor of claim 13 wherein said transducer means comprises two or more axially arranged, magnetically contiguous, oppositely polarized rings.

15. The torque sensor of claim 14 wherein said transducer means comprises a ring for each circumferential region.

16. The torque sensor of claim 13 wherein said transducer means comprises one ring containing said circumferential regions, each pair of contiguous regions being separated by a domain wall.

17. The torque sensor of claim 1 wherein said magnetic field sensor means is mounted in a fixed position proximate to said magnetoelastically active element.

18. The torque sensor of claim 14 wherein said sensor means is positioned proximate the contiguous end faces of said contiguous rings.

19. The torque sensor of claim 15 wherein said sensor means is positioned proximate the contiguous end faces of said contiguous rings.

20. The torque sensor of claim 16 wherein said sensor means is positioned proximate the domain walls between said regions.

21. The torque sensor of claim 13 wherein said circumferential regions are defined in two or more axially arranged, magnetically contiguous, oppositely polarized rings or a single ring containing said circumferential regions, each pair of contiguous regions being separated by a domain wall, and said sensor means comprises at least two sensors, said sensors being positioned proximate said ring, proximate but not at said domain walls and axially spaced apart a distance other than the interwall spacing distance or some whole number multiple thereof.

22. The torque sensor of claim 13 wherein said ring is attached coaxially with and about the surface of said member.

23. The torque sensor of claim 22 wherein said ring is attached to said member through an interference fit between the inner diameter of said ring and the outer diameter of said member.

24. The torque sensor of claim 23 wherein the inner diameter of said ring is smaller than the outer diameter of said member.

25. The torque sensor of claim 1 further including permeance increasing means for increasing the permeance of the flux closure path through the magnetic field sensor means.

26. The torque sensor of claim 1 further including yoke means fixed proximate to the magnetoelastically active element and the magnetic field sensor means for collecting magnetic flux from the magnetoelastically active element and directing said flux to the magnetic field sensor means.

27. The torque sensor of claim 13 further including yoke means fixed proximate to the transducer means and the magnetic field sensor means for collecting magnetic flux from the transducer means and directing said flux to the magnetic field sensor means.

28. The torque sensor of claim 1 wherein said magnetic field sensor means comprises a plurality of magnetic field sensing devices.

29. The torque sensor of claim 28 wherein at least two of said magnetic field sensing devices are connected differentially.

30. The torque sensor of claim 1 wherein said output signal is linearly indicative of the magnitude of the torque applied to said member.

31. The torque sensor of claim 30 wherein said output signal is an electrical signal.

32. The torque sensor of claim 1 wherein said member is formed of a low permeability material.

33. The torque sensor of claim 1 including low permeability spacing means for spacing said member from said magnetoelastically active element.

34. The torque sensor of claim 1 wherein said magnetoelastically active element is formed of nickel maraging steel.

35. The torque sensor of claim 1 wherein said magnetoelastically active element includes at least one axially distinct, unpolarized circumferential region.

36. The torque sensor of claim 16 wherein said transducer means further includes unpolarized circumferential regions positioned at the axial ends of the ring.

37. The torque sensor of claim 23 wherein said inner diameter of said ring is tapered and the outer diameter of said member is correspondingly tapered.

38. A method of sensing a torque applied to a torqued member extending in an axial direction, comprising the steps of:
   (a) providing a magnetoelastically active element endowed with an effective uniaxial magnetic anisotropy having the circumferential direction as the easy axis; said element comprising two or more axially distinct, magnetically contiguous circumferential regions which are oppositely magnetically polarized in a circumferential direction, said element being directly or indirectly attached to or forming part of the surface of said torqued member such that torque applied to the member is proportionally transmitted to said element;
   (b) producing a magnetic field as a consequence of the application of torque to said member; and
   (c) sensing the magnitude of the magnetic field at a position proximate to said magnetoelastically active element as an indication of the magnitude of the torque applied to said member.

39. The method of claim 38 including the additional step of producing an output signal indicative of the magnitude of the sensed magnetic field.

40. The method of claim 39 wherein said output signal is an electrical signal.

41. The method of claim 40 wherein said electrical output signal is linearly indicative of the magnitude of the torque applied to said member.

42. The method of claim 38 wherein said magnetoelastically active element is attached about the circumference of said member.

43. The method of claim 42 wherein said magnetoelastically active element is attached to said member via an interference fit.

44. The method of claim 43 wherein said magnetoelastically active element is tubular and said interference fit is produced by heat treatment effecting a shrinking action of said magnetoelastically active element onto said member.

45. The method of claim 43 wherein said interference fit is produced by forcing onto the outer surface of said member a tubular magnetoelastically active element having an inner diameter smaller than the outer diameter of said member.

46. The method of claim 43 wherein said interference fit is produced by tapering the outer surface of said member and forcing onto said tapered outer surface a tubular magnetoelastically active element having a corresponding taper on its inner diameter.

47. The method of claim 43 wherein said member is hollow and said interference fit is provided by the application of force in the hollow portion of said member to radially expand the outer diameter of said member into contact with said element.

48. The method of claim 38 wherein said magnetically active element forms a part of said member by forming a layer of said element on said member.

49. The method of claim 48 wherein said layer is formed by working a region of the surface of said member.

50. The method of claim 48 wherein said layer is formed by depositing a ferromagnetic, magnetostrictive material on the surface of said member.

51. The method of claim 38 wherein step (c) is accomplished at least in part by positioning a magnetic field sensing device proximate to and spaced from said magnetoelastically active element.

52. The method of claim 51 wherein said element comprises two circumferential regions and step (c) is accomplished by positioning a magnetic field sensing device proximate the domain wall between said contiguous regions.

53. The method of claim 38 wherein step (c) is accomplished at least in part by positioning a magnetic field sensing device in conjunction with a flux collecting yoke proximate to said magnetoelastically active element.

54. The method of claim 38 wherein the application of torque to said member causes said magnetoelastically active element to have a helical magnetic orientation with both circumferential and axial magnetization components and said sensing step comprises sensing the magnetic field arising from said axial components of magnetization.

55. The method of claim 38 wherein said element comprises two or more axially aligned, magnetically contiguous rings.

56. The method of claim 38 wherein said element comprises a ring for each circumferential region.

57. The method of claim 38 wherein said element comprises one ring containing said circumferential regions.

58. A transducing ring adapted to be attached directly or indirectly on the surface of a member to which a torque is applied about an axis extending axially thereof in such a manner that torque applied to said member is proportionally transmitted to said ring, said ring comprising a magnetoelastically active element which is endowed with an effective uniaxial magnetic anisotropy having the circumferential direction as the easy axis, said element comprising two or more axially distinct, magnetically contiguous circumferential regions which are oppositely magnetically polarized in the circumferential direction and having, when no torque is applied to said member, a circumferential magnetic orientation having only a circumferential component and, when a torque is applied to said member, a helical magnetic orientation having both circumferential and axial components, said ring producing a magnetic field varying with the torque applied to said member.

59. A method of producing a magnetoelastic torque transducer for attachment to a member to which an axial torque is applied, comprising the steps of:

(a) constructing a transducer from ferromagnetic, magnetostrictive material;

(b) endowing said transducer with an effective uniaxial magnetic anisotropy having the circumferential direction as the easy axis; and (c) magnetically polarizing the transducer to form two or more axially distinct, magnetically contiguous circumferential regions which are oppositely magnetically polarized in a circumferential direction.

* * * * *